(12) United States Patent
Kim et al.

(10) Patent No.: US 10,733,354 B2
(45) Date of Patent: Aug. 4, 2020

(54) SYSTEM AND METHOD EMPLOYING THREE-DIMENSIONAL (3D) EMULATION OF IN-KERF OPTICAL MACROS

(71) Applicant: GLOBALFOUNDRIES INC., Grand Cayman (KY)

(72) Inventors: Hojin Kim, Clifton Park, NY (US); Dongyue Yang, Ballston Lake, NY (US); Dong-Ick Lee, Commack, NY (US); Yue Zhou, San Jose, CA (US); Jae Ho Joung, Cohoes, NY (US); Gregory Costrini, Flanders, NJ (US); El Mehdi Bazizi, San Jose, CA (US); Dongsuk Park, Mechanicville, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 13 days.

(21) Appl. No.: 16/225,199

(22) Filed: Dec. 19, 2018

(65) Prior Publication Data
US 2020/0201955 A1 Jun. 25, 2020

(51) Int. Cl.
*G06F 30/398* (2020.01)

(52) U.S. Cl.
CPC ............................ *G06F 30/398* (2020.01)

(58) Field of Classification Search
USPC ............................................. 716/51
See application file for complete search history.

(56) References Cited

U.S. PATENT DOCUMENTS

| 6,921,916 B2 | 7/2005 | Adel et al. |
| 7,808,643 B2 | 10/2010 | Smith et al. |
| 2005/0113951 A1 | 5/2005 | Akiyama et al. |

(Continued)

OTHER PUBLICATIONS

Coventor, Defect Evolution in Next-Generation Extreme Ultraviolet Lithography, Semiconductor Engineering, https://semiengineering.com/defect-evolution-in-next-generation-extreme-ultraviolet-lithography/, 2016, pp. 1-3.

(Continued)

*Primary Examiner* — Eric D Lee
(74) *Attorney, Agent, or Firm* — Gibb & Riley, LLC; Anthony J. Canale

(57) ABSTRACT

Disclosed are embodiments of a system, method and computer program product for wafer-level design including chip and frame design. The embodiments employ three-dimensional (3D) emulation to preliminarily verify in-kerf optical macros included in a frame design layout. Specifically, 3D images of a given in-kerf optical macro at different process steps are generated by a 3D emulator and a determination is made as to whether or not that macro will be formed as predicted. If not, the plan for the macro is altered using an iterative design process. Once the in-kerf optical macros within the frame design layout have been preliminarily verified, wafer-level design layout verification, including chip and frame design layout verification, is performed. Once the wafer-level design layout has been verified, wafer-level design layout validation, including chip and frame design layout validation, is performed. Optionally, an emulation library can store results of 3D emulation processes for future use.

20 Claims, 11 Drawing Sheets

(56) References Cited

U.S. PATENT DOCUMENTS

| | | | |
|---|---|---|---|
| 2010/0190096 A1* | 7/2010 | Ausschnitt | G03F 1/14 430/5 |
| 2014/0172394 A1 | 6/2014 | Kuznetsov et al. | |
| 2014/0282324 A1* | 9/2014 | Greiner | G06F 30/39 716/111 |

OTHER PUBLICATIONS

Schulz et al., "Meeting Overlay Requirements for Future Technology Nodes with In-Die Overlay Metrology," Proc. SPIE. 6518, Metrology, Inspection, and Process Control for Microlithography XXI, 2007, pp. 1-11.

Ramanathan et al., "Overlay target selection for 20-nm process on A500 LCM," Metrology, Inspection, and Process Control for Microlithography XXIX, Proceedings of SPIE, vol. 9424, 2015, pp. 1-7.

Lozenko et al., "Matching Between Simulations and Measurements As a Key Driver for Reliable Overlay Target Design," Semiconductor Engineering, https://semiengineering.com/matching-between-simulations-and-measurements-as-a-key-driver-for-reliable-overlay-target-design/, 2018, pp. 1-97.

* cited by examiner

SYSTEM AND METHOD EMPLOYING THREE-DIMENSIONAL (3D) EMULATION OF IN-KERF OPTICAL MACROS

BACKGROUND

Field of the Invention

The present invention relates to integrated circuit (IC) design and manufacturing and, more particularly, to wafer-level design layout verification and, particularly, frame design layout verification.

Description of Related Art

During integrated circuit (IC) chip manufacturing, columns and rows of chips are formed on a wafer. The portion of the wafer that is not used for chip formation is referred to in the art as the wafer frame, which includes kerf regions (also referred to as scribe lines) that run between the columns and rows of chips. Oftentimes, macros are formed on the wafer frame in these kerf regions. Such macros include devices, circuits and/or optical structures, which are destroyed when the wafer frame is diced to form individual chips following wafer-level processing. Exemplary in-kerf optical macros include overlay targets or alignment marks.

Before chips and in-kerf macros are formed on wafers according to a wafer-level design layout, wafer-level design layout verification and validation are performed. Wafer-level design layout verification includes using simulations to verify the chip design layout and the frame design layout. Wafer-level design validation includes manufacturing chips and in-kerf macros on a test wafer according to the verified chip and frame design layouts. The fabricated chips on the test wafer can be tested and if they perform as predicted, the chip design layout will be considered validated for use in manufacturing. If not, the chip design layout will not be validated and further iterative chip design processing will be required. Additionally, during manufacturing of the chips, the in-kerf macros including any in-kerf optical macros (e.g., overlay targets and alignment marks) can be employed. If the actual structures of the in-kerf optical macros match the design and if all other in-kerf macros perform as required, then the frame design layout can be validated for use in manufacturing. If not, then the frame design layout will not be validated and further iterative frame design processing will be required.

Ideally, the wafer level-design layout verification process is sufficiently accurate to ensure validation of both the chip design layout and the frame design layout, thereby preventing the need for further iterative chip and/or frame design processing. Unfortunately, with technology node scaling, frame design layout validation has become harder to achieve.

SUMMARY

In view of the foregoing, disclosed herein are embodiments of a computer-aided design (CAD) system for wafer-level design including chip and frame design. The embodiments specifically employ a three-dimensional (3D) emulator to preliminarily verify the in-kerf optical macros included in a frame design layout. Specifically, during a preliminary in-kerf optical macro verification process, a 3D emulator can be used to generate 3D images of a given in-kerf optical macro within the frame design layout at different process steps and a determination can be made as to whether or not that in-kerf optical macro will be formed as predicted. As discussed in greater detail below in the detailed description section, the need for this preliminary in-kerf optical macro verification process stems from the fact that the designs of the in-kerf optical macros may not be scaled to the same extent as those of on-chip devices (e.g., optical macros may have larger pitches and/or critical dimensions) such that any technology-node specific process assumptions applied to on-chip devices during verification may not be applicable to the in-kerf optical macros and the patterning outcome (quality) of the in-kerf optical macros may deviate from the on-chip devices. Additionally, the optical macros may adapt altered process flows than on-chip devices to enhance optical signals from these optical macros and these altered process flows. If, during the preliminary in-kerf optical macro verification process, it is determined that the macro will not be formed as predicted, then the plan for the given in-kerf optical macro can be altered using an iterative design process. Specifically, the macro can be replaced or edited and/or the process flow used to form the macro can be adjusted. Once the in-kerf metrology macros within the frame design layout have been preliminarily verified, a wafer-level design layout verification process, including chip and frame design layout verification processes, can be performed. This verification process can include using the results of the 3D emulation of any in-kerf optical macros as an input to optical simulators such as overlay target or alignment simulation tools for further optical macro optimization. With verified and optimized designs, a wafer-level design layout validation process, including chip and frame design layout validation processes, can be performed. Performing preliminary in-kerf optical macro verification improves the overall accuracy of the verified frame design layout that is used during the wafer-level design simulation, optimization, and validation process and, thereby increases the probability that each in-kerf optical macro formed in the frame of a test wafer during the validation process will have the structure predicted and, thus, increases the probability that the wafer-level design layout will be validated. Also disclosed herein are embodiments of a computer-implemented design method and a computer program product associated with the above-described system.

More particularly, disclosed herein are embodiments of a computer-aided design (CAD) system. The system can include a computer-readable storage medium that stores a variety of inputs. These inputs can include, but are not limited to, a frame design layout with at least one in-kerf optical macro and a process flow for forming the in-kerf optical macro on a wafer. The frame design layout can indicate a first predicted structure for the in-kerf optical macro, which was previously determined during the design flow based on design rules for a specific technology node.

The system can further include a processor in communication with the computer-readable storage medium. The processor can perform a preliminary in-kerf optical macro verification process that includes evaluating three-dimensional (3D) images of the in-kerf optical macro at successive process steps within the process flow. These 3D images can be previously generated using a 3D emulator and stored in an in-kerf optical macro emulation library accessible by the processor or concurrently generated using the 3D emulator. In any case, the first predicted structure for the in-kerf optical macro (which was previously determined) can be compared to a second predicted structure for the in-kerf optical macro (as indicated by the 3D images) in order to determine whether or not the in-kerf optical macro should be preliminarily verified. When the second predicted structure differs from the first predicted structure, the in-kerf optical macro will not be preliminarily verified and the processor can cause the plan for the in-kerf optical macro to be altered during an iterative design process that is employed to compensate for misapplication of technology-node specific process assumptions used when the first predicted structure was determined. Alteration of the plan for the in-kerf optical macro can include, but it not limited to, replacing the in-kerf optical macro with a replacement in-kerf optical macro, editing the design of the in-kerf optical macro, or changing one or more process steps in the process flow for the in-kerf optical macro.

Once any in-kerf optical macros in the frame design layout are preliminarily verified, the processor can perform a wafer-level design layout verification process, including chip and frame design layout verification processes. This verification process can include using the results of 3D emulation of any in-kerf optical macro(s) in the frame design layout as inputs to optical simulators such as overlay target or alignment mark simulation tools for further optical macro optimization.

Also disclosed herein are embodiments of a computer-implemented design method. The method can include accessing, by a processor from a computer-readable storage medium, a variety of inputs including, but are not limited to, a frame design layout with at least one in-kerf optical macro and a process flow for forming the in-kerf optical macro on a wafer. The frame design layout can indicate a first predicted structure for the in-kerf optical macro, which was previously determined during the design flow based on design rules for a specific technology node.

The method can further include performing, by the processor, of a preliminary in-kerf optical macro verification process. Specifically, the preliminary in-kerf optical macro verification process can include evaluating three-dimensional (3D) images of the in-kerf optical macro at successive process steps within the process flow. These 3D images can be previously generated using a 3D emulator and stored in an in-kerf optical macro emulation library or concurrently generated using the 3D emulator. In any case, the preliminary in-kerf optical macro verification process can further include comparing the first predicted structure for the in-kerf optical macro (which was previously determined) and a second predicted structure for the in-kerf optical macro (as indicated by the 3D images) in order to determine whether or not the in-kerf optical macro should be preliminarily verified. When the second predicted structure differs from the first predicted structure, the in-kerf optical macro will not be preliminarily verified. In this case, the method can include causing the plan for the in-kerf optical macro to be altered during an iterative design process that is employed to compensate for misapplication of technology-node specific process assumptions used when the first predicted structure was determined. Alteration of the plan for the in-kerf optical macro can include, but it not limited to, replacing the in-kerf optical macro with a replacement in-kerf optical macro, editing the design of the in-kerf optical macro, or changing one or more process steps in the process flow for the in-kerf optical macro. The method can further include performing, by the processor, a wafer-level design layout verification process, including chip and frame design layout verification processes only after any in-kerf optical macros in the frame design layout have been preliminarily verified. This verification process can include using the results of the 3D emulation of any in-kerf optical macro(s) as an input to optical simulators such as overlay target or alignment mark simulation tools for further optical macro optimization.

Also disclosed herein are embodiments of a computer program product for implementing the above-described method. Specifically, the computer program product can include a computer readable storage medium having program instructions embodied therewith. The program instructions can be executable by a processor to cause the processor to perform the above-described method.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
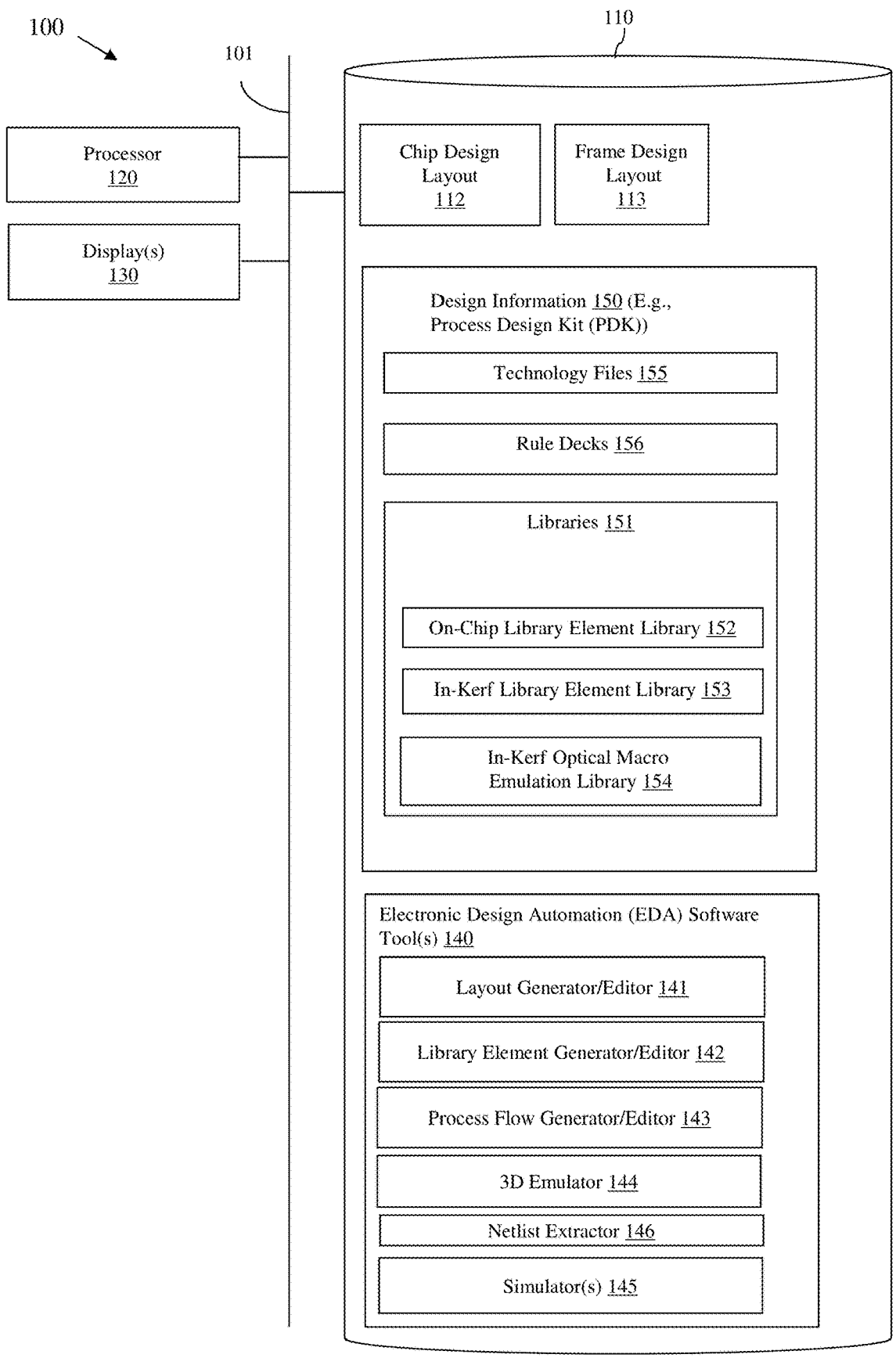
FIG. 1 is a schematic diagram illustrating the disclosed design system.

As mentioned above, during integrated circuit (IC) chip manufacturing, columns and rows of chips are formed on a wafer. The portion of the wafer that is not used for chip formation is referred to in the art as the wafer frame, which includes kerf regions (also referred to as scribe lines) that run between the columns and rows of chips. Oftentimes, macros are formed on the wafer frame in these kerf regions. Such macros include devices, circuits and/or metrology structures, which are destroyed when the wafer frame is diced to form individual chips following wafer-level processing.

Exemplary in-kerf metrology macros include optical macros such as overlay targets and alignment marks. Those skilled in the art will recognize that, during sequential patterning steps used in the formation of chips on a wafer, overlay and alignment are measured using overlay targets and alignment marks, respectively, in order to achieve high product yield. Overlay error refers to the deviation (beyond some allowable threshold) of the relative position of one pattern on one layer to another pattern the next layer. Overlay error is measured using overlay targets. Such overlay targets are formed one above the next in the kerf regions of the wafer during the sequential patterning steps and imaged after each patterning step using a metrology tool, which measures misalignment of the overlay targets from one layer to the next. Alignment error refers to the deviation (beyond some allowable threshold) of the wafer relative to the patterning tool itself. Alignment marks are formed at specific locations (e.g., usually at two or more specific locations) in the kerf regions of the wafer during each patterning step. Then, at the next patterning step, the previously formed alignment marks are aligned with corresponding alignment marks on the reticle of the lithography tool in order to align the reticle and the wafer in the x and y directions.

Before chips and in-kerf macros are formed on product wafers according to a wafer-level design layout, wafer-level design layout verification and validation are typically performed.

Generally, the wafer-level design layout verification process begins with a chip design layout at a specific technology node (e.g., 45 nm silicon-on-insulator (SOI), 32 nm SOI, 22 nm SOI, etc.). Layout versus schematic (LVS) and design rule checking (DRC) processes can be performed. Then, netlists can be extracted from the chip design layout and simulations can be performed performed using the netlists. These simulations can include electrical simulations (e.g., conventional simulation program with integrated circuit emphasis (SPICE) simulations) of electronic circuits defined by the netlists, opto-electronic simulations (e.g., opti-SPICE simulations) of opto-electronic circuits defined by the netlists and/or optical simulations of optical devices defined by the netlists. The results of the simulations can then be used to generate performance models for on-chip devices and circuits. If the performance models indicate that the chips will perform as required by the design specifications, the chip design layout will be verified and can be released in a data format used for the exchange of layout data of integrated circuits and/or symbolic data format (e.g., GDSII, GL1, OASIS, map files, or any other suitable format for storing such design data structures). If not, the chip design layout will not be verified and further iterative chip design processing will be required.

The wafer-level design layout verification process can also include verification of the frame design layout. In the same manner as described above, netlists can be extracted from the frame design layout and simulations (particularly optical simulations in the case of overlay targets and alignment marks) can be performed using the netlists. The results of these simulations can then be used to generate performance models for the in-kerf macros. If the performance models indicate that the in-kerf macros will perform as required, the frame design layout will be verified and can be released in the above-mentioned data format. If not, the frame design layout will not be verified and further iterative frame design processing will be required.

Once both the chip design layout and the frame design layout have been verified, wafer-level design layout validation, including chip and frame design layout validation, can be performed.

The wafer-level design layout validation process can include manufacturing a test wafer according to the previously verified chip and frame design layouts. The fabricated chips on the test wafer can be tested and if they perform as predicted the chip design layout will be considered validated for use in product manufacturing. If not, the chip design layout will not be validated for use in product manufacturing and further iterative chip design processing will be required. Additionally, during manufacturing of the chips on the test wafer, the in-kerf macros including the in-kerf optical macros (e.g., the overlay targets and alignment marks) can be manufactured and employed (e.g., for overlay monitoring, alignment, in-line monitoring, etc.). If the actual structures of the in-kerf optical macros match the design and, thereby enable overlay monitoring and alignment and if all other in-kerf macros perform as required, then the frame design layout will be validated for use in product manufacturing. If not, then the frame design layout will not be validated and further iterative frame design processing will be required.

Ideally, the wafer-level design layout verification process is sufficiently accurate to ensure validation of both the verified chip design layout and the verified frame design layout. Unfortunately, with technology node scaling, frame design validation has become harder to achieve. Specifically, as technology nodes have decreased in size, there has been a corresponding increase in the rate at which wafer-level design layouts are invalidated due to issues associated with the in-kerf optical macros and, particularly, due to a finding that one or more actual in-kerf optical macro structures, which are formed on the frame of a test wafer, do not match the design for those macros. Failing to identify problems associated with in-kerf optical macro designs and to replace those in-kerf optical macros within the frame design layout in order to correct the problems before performing a wafer-level design validation process can result in costly and time-consuming iterative redesign processes. Therefore, the inventors of the present invention have investigated why this mismatch occurs between the actual in-kerf optical macro structures and the design for those macros when manufacturing chips at smaller technology nodes, identified a problem associated with the currently used frame design layout verification process, and developed an improved design system and method layout that solves this problem using a preliminary in-kerf optical macro verification process that employs three-dimensional emulation and, optionally, an updated and evolving in-kerf optical macro emulation library in order to facilitate timely verification and validation of a wafer-level design layout including the frame design.

More particularly, as mentioned above, the inventors of the present invention have investigated why, as technology nodes have decreased (e.g., to 22 nm and smaller technology nodes, such as 22 nm fully-depleted silicon-on-insulator (22 nmFD-SOI), 14 nm FD-SOI, 12 nm FD-SOI, 10 nm FD-SOI, 7 nm FD-SOI, etc.), there has been an increase in the rate at which wafer-level design layouts are invalidated due to issues associated with in-kerf optical macros and, particularly, due to a finding that one or more actual in-kerf optical macro structures, which are formed on the frame of a test wafer, do not match the design for those macros. During this investigation, the inventors identified a problem associated with the currently used frame design layout verification process. Specifically, as mentioned above, when verifying the frame design optical simulations of the in-kerf optical macros are performed. These optical simulations are generated based on netlists extracted from the frame design layout and on design rules. The design rules are typically determined based on process assumptions associated with the specific technology node at issue and on various fail mechanisms that can occur in light of those process assumptions. Process assumptions (also referred to herein as process parameter assumptions) include predictions made regarding parameters associated with the processes performed at the various fabrication levels for chips at the specific technology node and the expected variations in those parameters. For example, process assumptions can include, but are not limited to, various critical dimensions associated with on-chip patterned features at the different fabrication levels, such as minimum and maximum widths of the patterned features, minimum and maximum lengths of the patterned features, minimum and maximum pitches, etc. and can further indicate expected results of the process steps (e.g., deposition steps, etch steps, etc.) in the process flow given those critical dimensions.

During this investigation, the inventors noted that, at the smaller technology nodes, the critical dimensions associated with on-chip patterned features were often significantly smaller than the critical dimensions associated with in-kerf optical macro patterned features, which were to be formed in the kerf regions of the frame on the same wafer and which were not considered in the process assumptions. That is, the critical dimensions associated with the on-chip patterned features were on the scale of tens of nanometers or less (e.g., 22 nm, 14 nm, 12 nm, 10 nm, 7 nm, etc.); whereas the critical dimensions associated with the in-kerf optical macro patterned features were on the scale of a hundred nanometers or more. The inventors further found that oftentimes the actual results of at least some process steps (e.g., deposition steps, etch steps, etc.) in the process flow would vary for the patterned features of the in-kerf optical macros on the frame as compared the on-chip patterned features given those differences in the critical dimensions. In other words, one or more process assumptions directed to the expected results of process steps in the process flow for forming the in-kerf optical macro were inapplicable to the in-kerf optical macros due to the significantly larger critical dimensions associated with those in-kerf optical macros. Additionally, the optical macros may adapt altered process flows than on-chip devices to enhance optical signals from these optical macros and these altered process flows. Consequently, a predicted structure of a given in-kerf optical macro, which was generated based on the design rules for the technology node and used as an input to the optical simulation during frame design layout verification could, unknowingly, be inaccurate. So, while the frame design has been verified, when that in-kerf optical macro is later formed on a test wafer during a frame design validation process using the verified frame design layout, the actual structure of the in-kerf optical macro would be different and could fail.

In view of the foregoing, disclosed herein are embodiments of a computer-aided design (CAD) system for wafer-level design including chip and frame design. The embodiments specifically employ a three-dimensional (3D) emulator to preliminarily verify the in-kerf optical macros included in a frame design layout. Specifically, during a preliminary in-kerf optical macro verification process, a 3D emulator can be used to generate 3D images of a given in-kerf optical macro within the frame design layout at different process steps and a determination can be made as to whether or not that in-kerf optical macro will be formed as predicted. If not, the plan for the given in-kerf optical macro can be altered using an iterative design process. Specifically, the macro can be replaced or edited and/or the process flow used to form the macro can be adjusted. Once the in-kerf optical macros within the frame design layout have been preliminarily verified, a wafer-level design layout verification process, including chip and frame design layout verification processes, can be performed. Once the wafer-level design layout has been verified, a wafer-level design layout validation process, including chip and frame design layout validation processes, can be performed. Performing preliminary in-kerf optical macro verification improves the overall accuracy of the verified frame design layout that is used during the wafer-level design validation process and, thereby increases the probability that each in-kerf optical macro formed in the frame of a test wafer during the validation process will have the structure predicted and, thus, improves the probability that the wafer-level design layout will be validated. Also disclosed herein are embodiments of a computer-implemented design method and a computer program product associated with the above-described system.

More particularly, referring to FIG. 1, disclosed herein are embodiments of a computer-aided design (CAD) system 100. The system 100 can include one or more processors 120, one or more displays 130, and one or more computer readable storage mediums or devices 110. The various components of the system 100 including, but not limited to, the processor(s) 120, display(s) 130, and storage mediums(s) 110 can be interconnected over a system bus 101, as illustrated, and/or over a wired or wireless network (not shown). For purposes of illustration, the system 100 is described below and illustrated in FIG. 1 as if it incorporates only a single processor and single storage medium. However, it should be understood that, alternatively, the system can incorporate multiple processors for performing one or more of the different steps in the design flow, as discussed below, and multiple storage mediums that store the various data and tools, described below, and that are accessible by one or more processors during the different steps in the design flow.

The storage medium 110 can store one or more electronic design automation (EDA) tools 140 (e.g., specialized software program(s)), which include instructions that are executable by the processor 120 to cause perform different steps in the design flow. Exemplary EDA tools 140 can include, but are not limited to: a schematic generator, a floorplanning tool, a power planning tool, an input/output pin placement tool, a library element placement tool, a clock planning tool, a wire routing tool, a layout versus schematic (LVS) tool, a three-dimensional (3D) emulator 144, a netlist extractor 145 and one or more simulators 146 (e.g., a conventional simulation program with integrated circuit emphasis (SPICE) simulator for performing electronic simulations, an opti-SPICE simulator for performing opto-electronic simulations and an optical simulator for performing optical simulations). Optionally, these EDA tools 140 can further include a layout generator/editor 141, a library element generator/editor 142 and a process flow generator/editor 143.

The storage medium 110 can further store design information 150, which is accessible and usable by one or more of the EDA tools 140 during the different steps of the design flow. The design information 150 can be in the form, for example, of a process design kit (PDK). The design information 150 can include, but is not limited to, technology files 155 for a specific technology node, design rule decks 156 for the specific technology node, various libraries 151 such as an on-chip library elements library 152 and an in-kerf library elements library 153. As discussed in greater detail below, these libraries 151 can also optionally include an optical macro emulation library 154.

For purposes of this disclosure, technology files 155 for the specific technology node refer to files that define the layers and devices that are available in the specific technology node for a particular fabrication process as well as the generic physical and electrical rules for the specific technology node. Design rule decks 156 for a specific technology node refer to discrete sets of design rules (also called run sets). Each rule deck includes a set of design rules that are applicable to one or more of the particular processes in the design flow (e.g., during floorplanning, power planning, input/output pin placement, library element placement, clock planning, wire routing, a layout versus schematic (LVS) check, 3D emulation, simulations, etc.). The design rules are determined based on process assumptions associated with the specific technology node at issue and on various fail mechanisms that can occur in light of those process assumptions. Furthermore, the process assumptions include predictions made regarding parameters associated with the processes performed in the process flows at the various fabrication levels for chips at the specific technology node and the expected variations in those parameters. For example, process assumptions can include, but are not limited to, various critical dimensions associated with on-chip patterned features at the different fabrication levels, such as minimum and maximum widths of the patterned features, minimum and maximum lengths of the patterned features, minimum and maximum pitches, etc. and can further indicate expected results of the process steps (e.g., deposition steps, etch steps, etc.) in the process flow given those critical dimensions.

Library element libraries refer to databases that define multiple different library elements that can be selected and incorporated into a schematic diagram of a chip under design (e.g., see the on-chip library elements library 152) or a wafer frame under design (e.g., see the in-kerf library elements library 153) under design and the process flows for forming those library elements. The library elements listed in the on-chip library elements library 152 can include, for example, conventional library elements, such as discrete devices, standard cells, parameterized cells (Pcells), and/or circuit blocks (e.g., for memories and/or processors). Exemplary library elements listed in the in-kerf library elements library 153 can include library elements corresponding to in-kerf test macros and in-kerf optical macros (e.g., overlay targets and alignment marks).

The disclosed system embodiments can be employed during wafer-level design and the inventive aspects of the disclosed system embodiments are directed to frame design layout verification and, particularly, to verification of in-kerf optical macros included in the frame design layout to address the problem discussed above regarding the increase in the rate at which wafer-level design layouts are invalidated due to issues associated with in-kerf optical macros. It should be understood that the provided description and illustrations of the disclosed system embodiments are not intended to be limiting and that the system 100 can further include additional features, which are associated with any aspect of wafer-level design including, but not limited to, the physical design processes performed to generate chip and frame design layouts, the chip and frame design layout verification processes and the chip and frame design layout validation processes.

During wafer-level design, the system 100 can receive design inputs from a user (i.e., a designer) through a graphical user interface (GUI) and the processor 120 can use the design inputs to develop an initial chip design and to further develop an initial frame design given the initial chip design. For example, the processor 120 can generate (e.g., can execute a schematics generator, including application of the corresponding design rule decks, to generate) schematic diagrams for the chip and frame based on the design the design inputs. Generation of the schematic diagrams can include selection of library elements from the libraries 152-153 and establishing connections between those library elements an input or output nodes, as necessary.

The processor 120 can further perform (e.g., can execute appropriate EDA tools 140, including application of the corresponding design rule decks, to perform) various physical design processes including, but are not limited to, floorplanning, power planning, input/output pin placement, library element placement, clock planning, and wire routing. The above-described physical design processes and tools used to perform them are well known in the art and, thus, a detailed description has been omitted from this specification in order to allow the reader to focus on the salient aspects of the disclosed embodiments. In any case, the result of these physical design processes is the generation of a wafer-level design layout including a chip design layout 112 and a frame design layout 113.

The processor 120 can subsequently perform a wafer-level design layout verification process including verification of both the chip design layout verification and the frame design layout. However, if/when the frame design layout 113 includes one or more in-kerf optical macros (e.g., in-kerf overlay target(s) or in-kerf alignment mark(s), as defined above), the processor 120 can first perform a preliminary in-kerf optical macro verification process for each differently designed in-kerf optical macro (e.g., for each different in-kerf optical macro library element) included in the frame design layout.

For the preliminary in-kerf optical macro verification processes, the processor 120 can access a variety of inputs stored in the storage medium 110. These inputs can include, but are not limited to, the frame design layout 113 and corresponding process flow(s) for forming the in-kerf optical macros included in the frame design layout 113. The structure of the in-kerf optical macro included in the frame design layout 113 is considered a predicted structure (referred to herein as the first predicted structure), which has been determined given the technology node-specific design rules (i.e., the design rule decks 156) applied during the various physical design processes mentioned above.

In order to preliminarily verify a given in-kerf optical macro included in the frame design layout 113, the processor 120 can perform a 3D emulation process (e.g., can execute the 3D emulator 144, including emulations rules, to perform a 3D emulation process). During this 3D emulation process, 3D images of the in-kerf optical macro at successive process steps within the corresponding process flow are generated and evaluated to determine a second predicted structure for that in-kerf optical macro. The first predicted structure for the in-kerf optical macro (which was previously determined and included in the frame design layout 113) and the second predicted structure for the in-kerf optical macro (as indicated by the 3D images) can subsequently be compared in order to determine whether or not that given in-kerf optical macro should be preliminarily verified.

The comparison of the two predicted structures can be performed automatically by the processor 120 by executing comparison software available through the 3D emulator 144 or some other EDA tool (not shown). Alternatively, comparison of the two predicted structures can be performed by the user. For example, the 3D emulator 144 can cause the generated 3D images to be displayed on a display screen 130 for evaluation by the user. In this case, the user can determine if the second predicted structure matches the first predicted structure and, through a GUI, can enter a finding regarding the given in-kerf optical macro.

If/when the second predicted structure differs from the first predicted structure, the given in-kerf optical macro will not be preliminarily verified and the processor 120 can cause the plan for the given in-kerf optical macro to be altered using an iterative design process that is employed, prior to frame design layout verification, in order to compensate for misapplication of technology-node specific process assumptions used when the first predicted structure was determined. Alteration of the plan for the in-kerf optical macro can include, but it not limited to, replacing the in-kerf optical macro with a replacement in-kerf optical macro, editing the design of the in-kerf optical macro, or changing one or more process steps in the process flow for the in-kerf optical macro.

More specifically, as mentioned above, the design rules (i.e., the design rule decks 156) applied when generating the chip and frame design layouts during the physical design processes are based on process assumptions associated with different fabrication levels of chips on a wafer at a specific technology node. These process assumptions can include critical dimensions associated with on-chip patterned features. However, the critical dimensions associated with the on-chip patterned features may be significantly smaller than the critical dimensions associated with the patterned features of the given in-kerf optical macro such that one or more of the process assumptions are inapplicable to that given in-kerf optical macro. When this occurs, the given in-kerf optical macro may not be formed as predicted. Thus, the embodiments disclosed herein provide a means for detecting when technology-node specific process assumptions have been misapplied to a given in-kerf optical macro and a means for altering a plan associated with that in-kerf optical macro in order to compensate for this misapplication of the technology-node specific process assumptions. Specifically, the system embodiments disclosed herein employ 3D emulation of the process flows for the in-kerf optical macros considering the specifications and, particularly, the critical dimensions for those in-kerf optical macros. The 3D images produced during 3D emulation facilitate the visualization and analysis of each step in a process flow including those steps that may be pattern-dependent (including, but not limited to, deposition processes, etch processes and alignment processes) and that, due to the larger critical dimensions of the in-kerf optical macros, may result in optical macro structure failures. For example, the 3D shapes of trenches (e.g., volume or length, width and depth) at one fabrication level can impact whether or not, during a subsequent deposition process, the trenches will be filled. Similarly, the 3D shapes of previously filled trenches (e.g., volume or length, width and depth) at one fabrication level can impact whether or not, during a subsequent etch process, all fill material can be selectively removed those trenches. Additionally, the dimensions of alignment features at one fabrication level may impact whether or not those features are visible to the appropriate alignment tools at subsequent fabrication levels. By performing 3D emulation and evaluating the resulting 3D images, the disclosed system embodiments provide a means for detecting pattern-dependent process steps that can result in in-kerf optical macro structure failures (due to the relatively large critical dimensions) and for determining a plan to correct for such failures. The following examples are provided to better illustrate this feature of the disclosed system 100.

Example I

Figure 2:
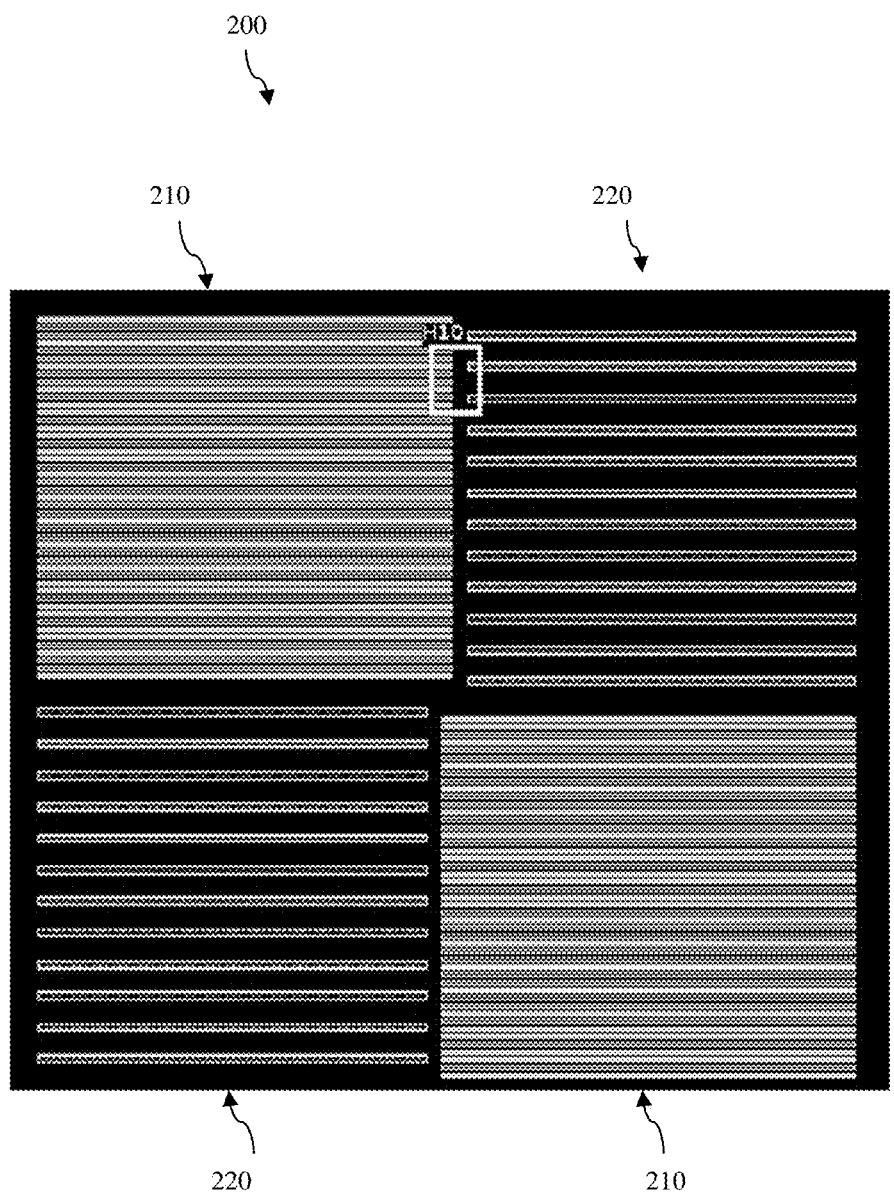
FIG. 2 shows a first predicted structure of an overlay target contained in a frame design layout.

FIG. 2 is an illustration of a first predicted structure 200 of an in-kerf optical macro contained in a frame design layout. In this case, the in-kerf optical macro is an overlay target with a diffraction based overlay configuration (i.e., a DBO overlay target) that includes four sets of patterned metal wires (e.g., patterned copper wires) in a metal level (e.g., the first metal level (M0)) on a wafer. The four sets include two first sets 210 at opposite corners and two second sets 220 at opposite corners. The patterned metal wires in the first sets 210 can have a first width (e.g., 60 nm) and first pitch. The patterned metal wires in the second sets 220 can have a second width (e.g., 150 nm) that is greater than the first width and a second pitch that is greater than the first pitch.

Figure 3A:
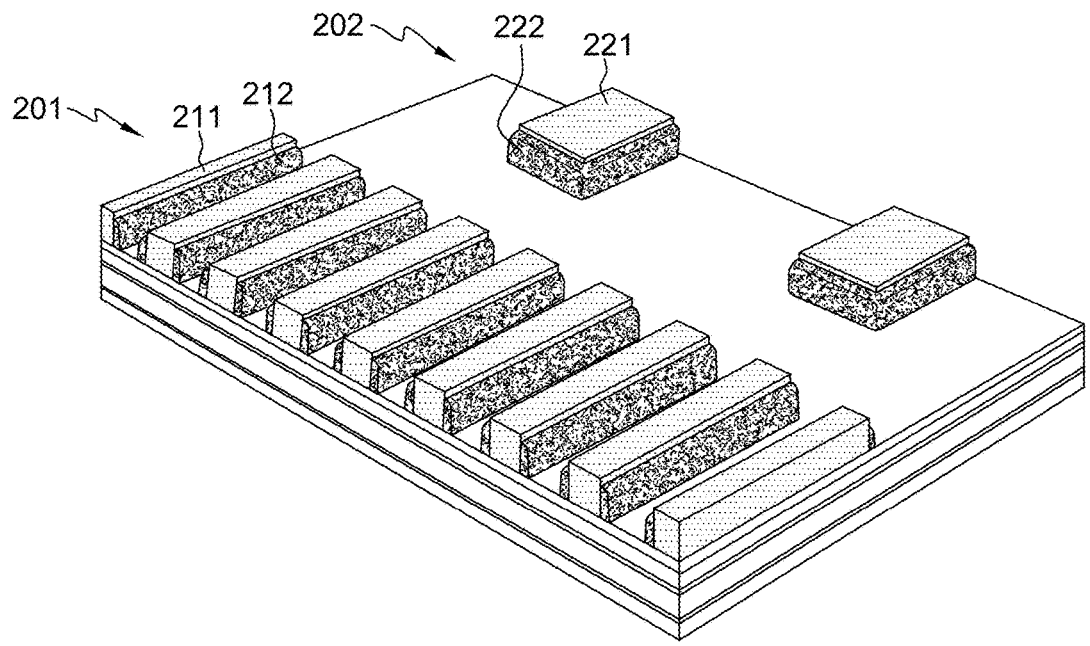
FIGS. 3A-3D show three-dimensional images generated during an emulation process performed with respect to the overlay target.
Figure 3B:
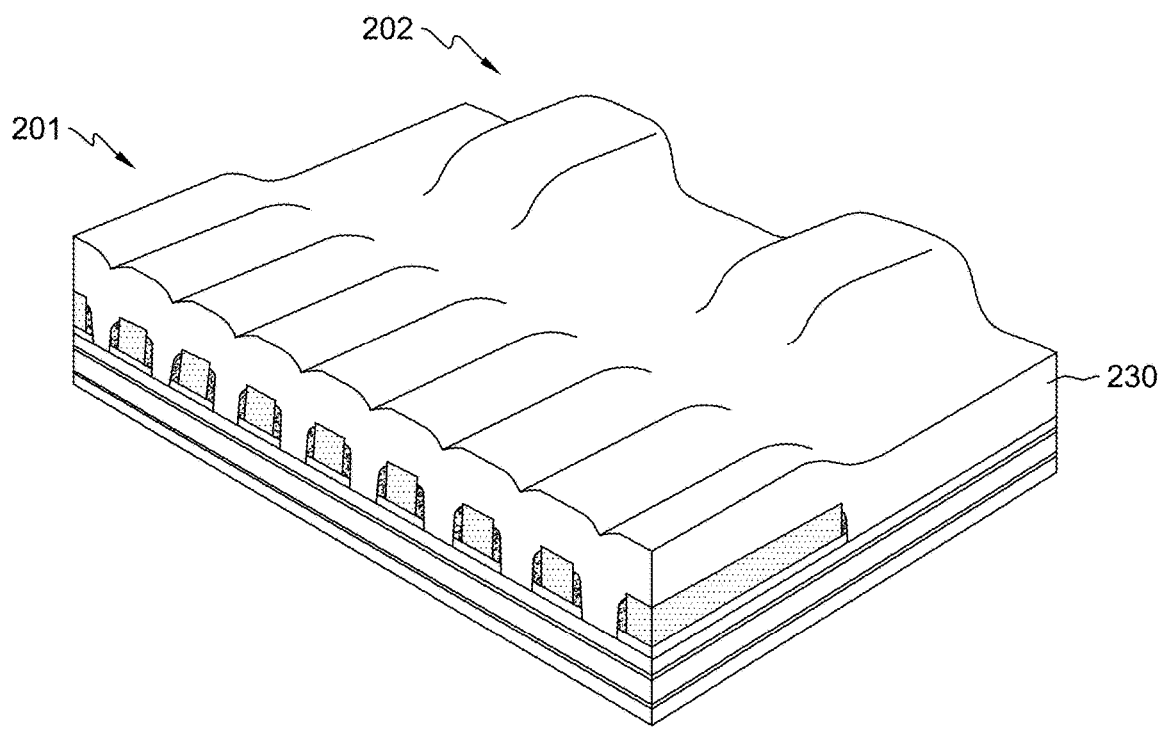
Figure 3C:
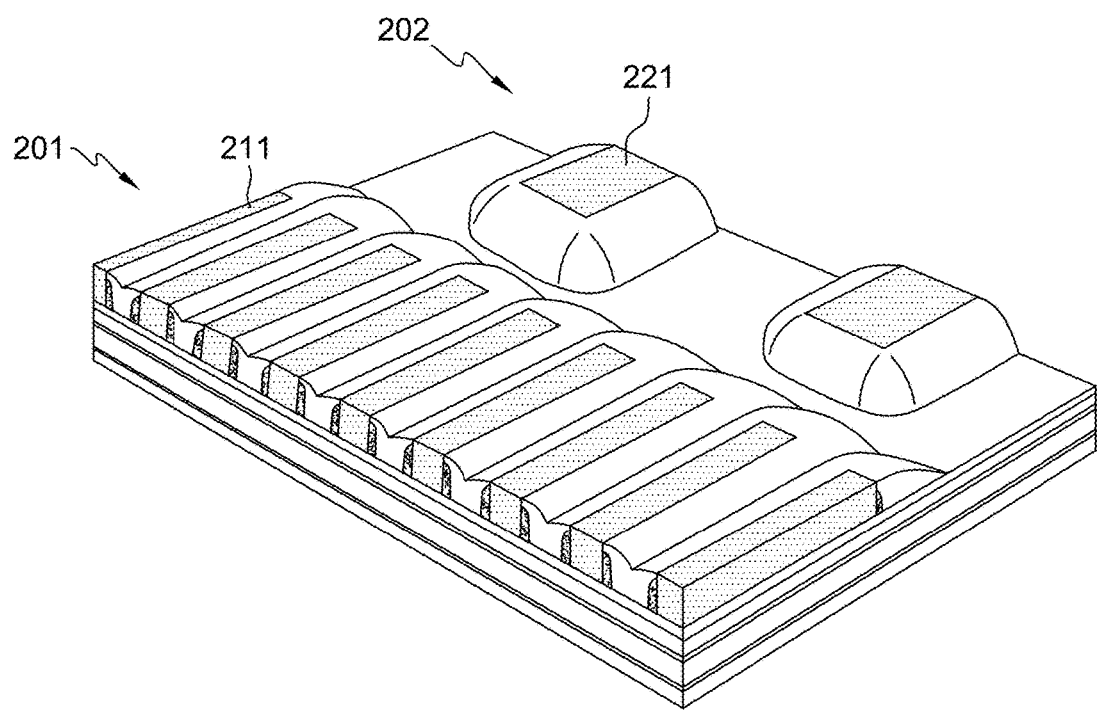
Figure 3D:
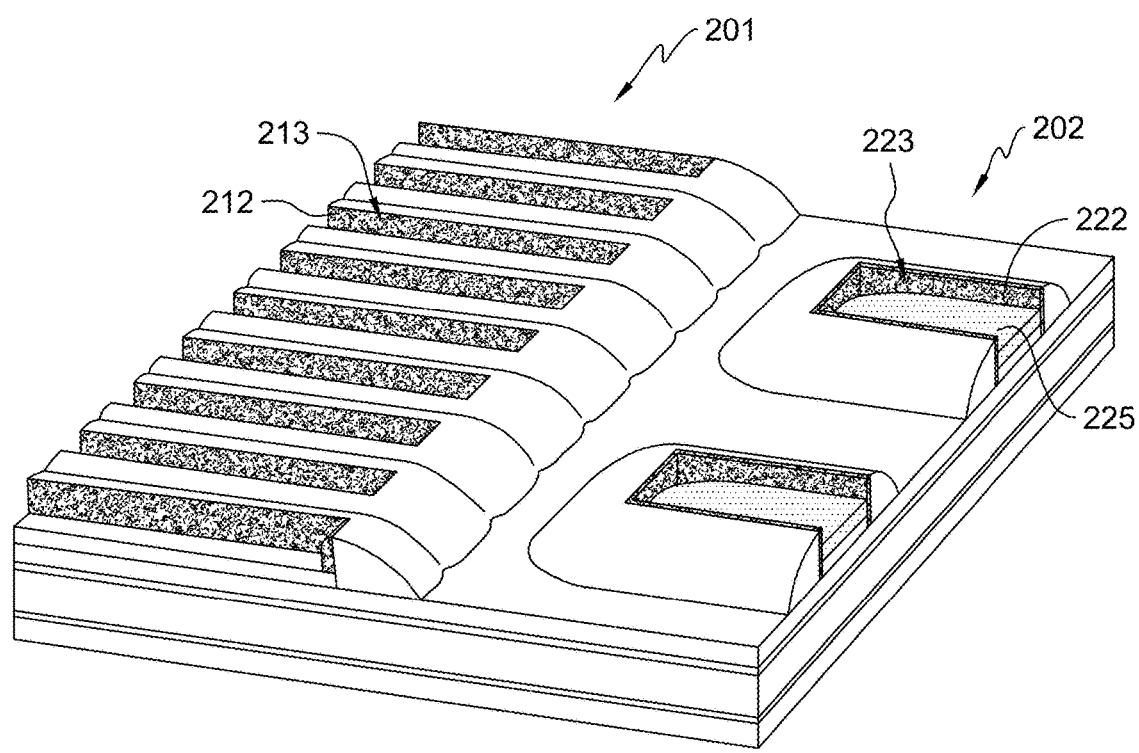

FIGS. 3A-3D show a selected few of the 3D images that can be generated by the processor 120, when performing the 3D emulation process to generate the 3D images of the in-kerf optical macro of FIG. 2 at successive process steps within the corresponding process flow in order to produce a second predicted structure for DBO overlay target. FIGS. 3A-3D include 3D renderings of the area H10 shown in FIG. 2 at a select few of the different process steps used when forming such a DBO overlay target. Specifically, FIG. 3A shows a 3D rendering of this area H10 following process steps including formation of different sets of sacrificial mandrels 211, 221 in different regions 201, 202 of a wafer and formation of sidewalls spacers 212, 222 on the sacrificial mandrels 211, 221, respectively. As illustrated, the sacrificial mandrels 211 and 221 have different widths (e.g., 60 nm and 150 nm, respectively) and different pitches. FIG. 3B shows a 3D rendering of this area H10 following deposition of a sacrificial layer 230 over the partially completed structure shown in FIG. 3A. FIG. 3C shows a 3D rendering of this area H10 following exposure of the tops of the sacrificial mandrels 211, 221. FIG. 3D shows a 3D rendering of this area H10 following an etch process to remove the sacrificial mandrels 211 and 221 to form sidewall spacer 212-lined openings 213 in the region 201 and sidewall spacer 222-lined openings 223 in the region 202. However, although the technology node-specific process assumptions would indicate that the sacrificial mandrels 211, 221 would be entirely removed, the etch process used is pattern dependent and the sacrificial mandrels 221 are not completely removed. Specifically, the sacrificial mandrels 221 are too large (i.e., too wide) and, as a result, a sacrificial material residue 225 remains at the bottom of the openings 223. During subsequent processes (not shown), when additional etch processes are performed to extend the openings 213, 223 into a dielectric layer below to form wire trenches and metal (e.g., copper) is deposited into those wire trenches to form the two sets of patterned metal wires, the residue 225 prevents wire trench formation in the region 202. As a result, the sets of patterned wires are not formed in the region 202 and the second predicted structure 200' for the DBO overlay target, as shown in FIG. 4, only includes the two first sets 210 of patterned metal wires.

Figure 4:
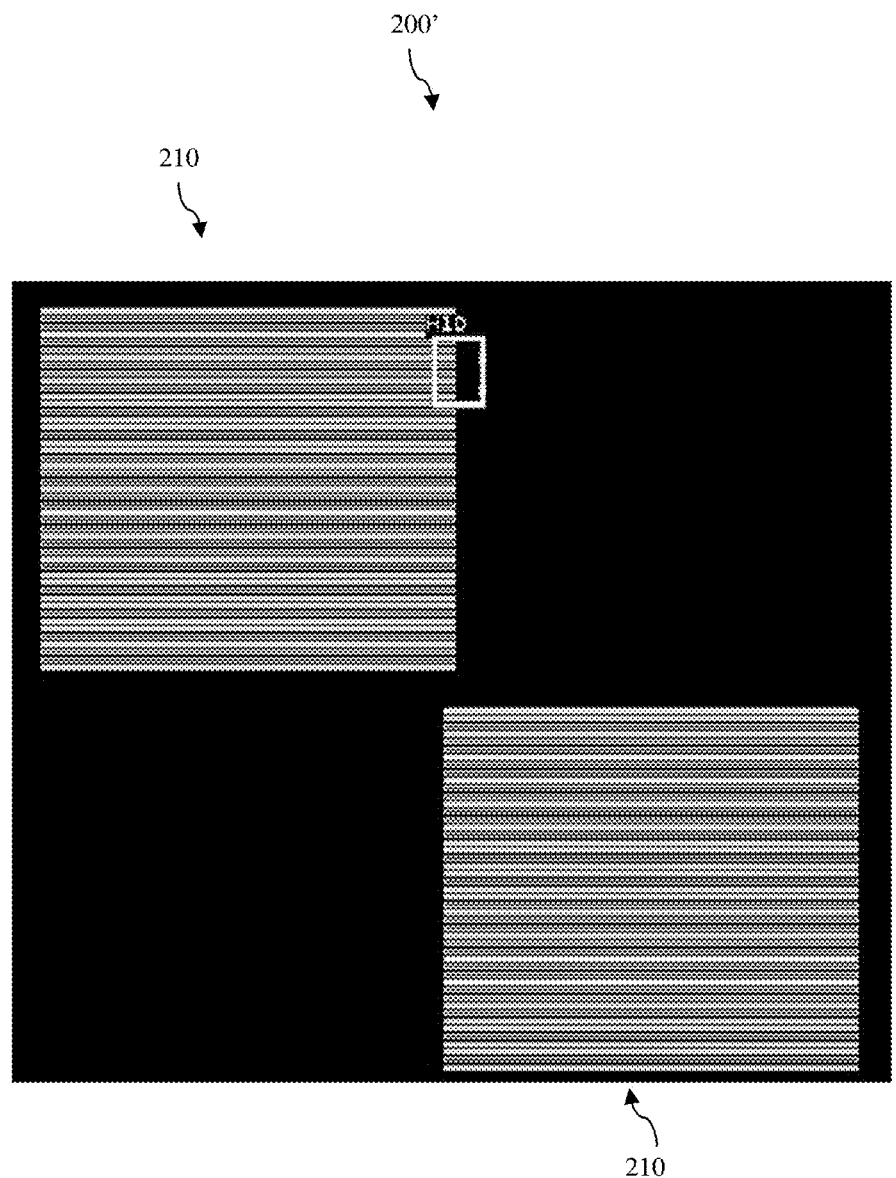
FIG. 4 shows a second predicted structure for the overlay target, as indicated by the emulation process.
Figure 5:
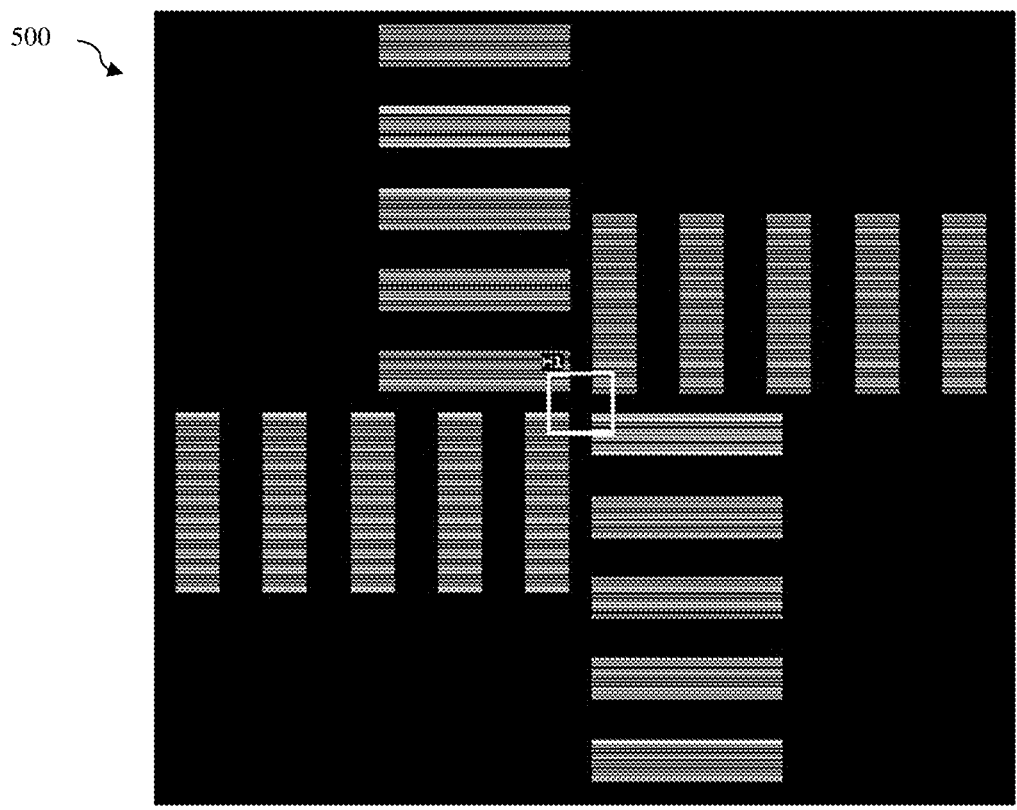
FIG. 5 shows a first predicted structure of a potential replacement overlay target.

Since the second predicted structure 200' shown in FIG. 4 differs from the first predicted structure 200 shown in FIG. 2, the DBO overlay target will not be preliminarily verified and the processor 120 can cause the plan for that in-kerf optical macro to be altered based on the results of the comparison between the second predicted structure 200' and the first predicted structure 200 and further based on an evaluation of the 3D images. Alteration of the plan can include employing the layout generator/editor 141 to replace the DBO overlay target with a replacement in-kerf optical macro that is selected, either automatically or by a user, from the in-kerf library elements library 153. For example, FIG. 5 is an illustration of a first predicted structure 500 of a different in-kerf optical macro and, particularly, an overlay target with KLA-Tencor™'s advanced imaging optical configuration (i.e., an AIM overlay target). This AIM overlay target can be selected from the in-kerf library elements library 153 to replace the DBO overlay target because of the smaller widths and pitches in its patterned metal wires. Alternatively, alteration of the plan can include employing the library element generator/editor 142 to edit the design of the DBO overlay target and employing the process flow generator/editor 143 to make any required adjustments to the process flow in light of the edited design. Such editing could include, for example, reducing the widths of the patterned metal wires, segmenting the patterned metal wires, or any other suitable design edit that would ensure complete removal of a sacrificial mandrel material during the sacrificial mandrel removal process. Alternatively, alteration of the plan can include employing the process flow generator/editor 143 to adjust the process specifications for the etch process used to remove the sacrificial mandrels 211, 221 in a manner that does not significantly impact on-chip feature. Such adjusting can include, for example, increasing the etch time, changing the etchant, and/or make any other suitable adjustment to ensure complete removal of the sacrificial mandrel material.

Example II

Figure 6:
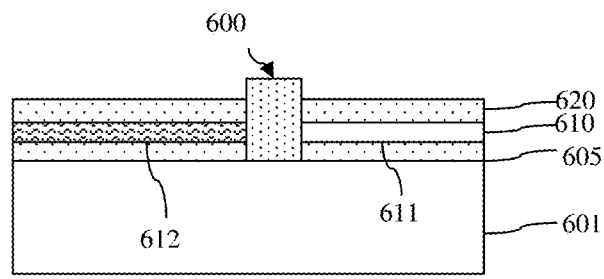
FIG. 6 shows a portion of a first predicted structure of an alignment mark contained in a frame design layout.

FIG. 6 is an illustration of a portion of a first predicted structure 600 of another in-kerf optical macro that could be contained in the frame design layout 113. In this case, the in-kerf optical macro is an alignment mark on a hybrid semiconductor-on-insulator (SOI) wafer at a relative small technology node (e.g., 14 nm, 12 nm, 10 nm, 7 nm, etc.). The first predicted structure 600 for the alignment mark includes a dielectric-filled trench that extends vertically through an oxide layer 620, through a thin semiconductor layer 610 between a first semiconductor material portion 611 (e.g., a silicon portion) and a second semiconductor material portion 612 (e.g., a strained silicon germanium portion) and further through a buried oxide (BOX) layer 605 on a silicon substrate 601.

Figure 7A:
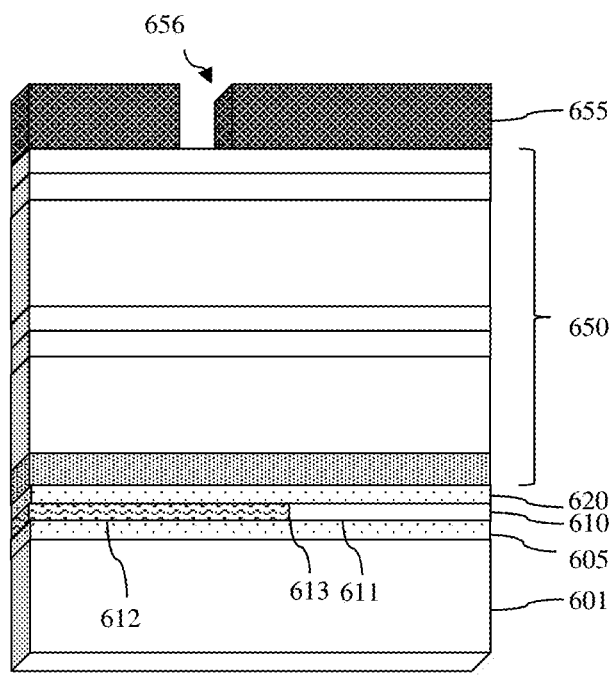
FIGS. 7A and 7B show a three-dimensional image generated during an emulation process performed with respect to the alignment mark and a second predicted structure of the alignment mark, as indicated by that emulation process, respectively.
Figure 7B:
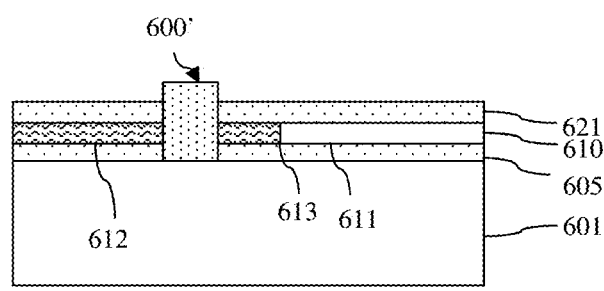

FIGS. 7A-7B show a selected few of the 3D images that can be generated by the processor 120, when performing the 3D emulation process to generate the 3D images of alignment mark of FIG. 6 at successive process steps within the corresponding process flow in order to produce a second predicted structure for that alignment mark. FIG. 7A shows a 3D rendering of a partially completed structure following formation of a multi-layer stack 650 on the oxide layer 620 and formation of a mask layer 655 with a patterned opening 656, which will subsequently be extended through the stack 650, oxide layer 620, the semiconductor layer 610, and the BOX layer 605. The patterned opening 656 is typically aligned using the interface 613 between the first semiconductor material portion 611 and the second semiconductor material portion 612. However, since the semiconductor layer 610 is relatively thin (e.g., 14 nm or less), alignment of the opening 656 with this interface 613 is difficult using currently available alignment tools. As a result, the opening 656 may be offset from the interface 613. Thus, the second predicted structure 600' for this alignment mark, as shown FIG. 7B, extends vertically through the oxide layer 620, through the second semiconductor material portion 612 of the semiconductor layer 610 such that it is separated from the interface 613 and through the buried oxide (BOX) layer 605. That is, the alignment mark does not physically separate the first semiconductor material portion 611 and the second semiconductor material portion 612.

Figure 8:
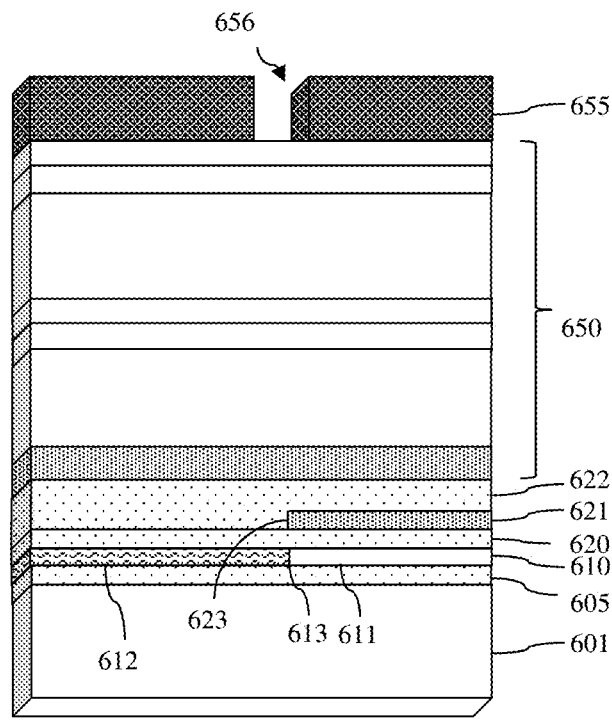
FIGS. 8 and 9 show change in the process flow for forming the alignment mark and a second predicted structure for the alignment mark, given this change in the process flow.
Figure 9:
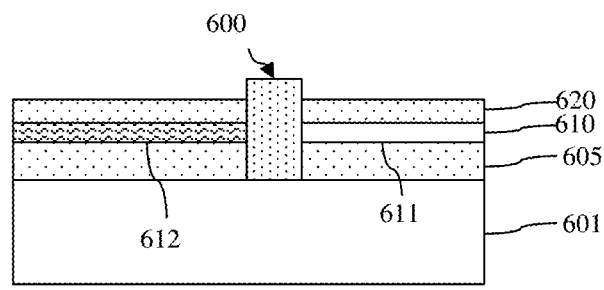

Since the second predicted structure 600' shown in FIG. 7B differs from the first predicted structure 600 shown in FIG. 6, the alignment mark will not be preliminarily verified and the processor 120 can cause the plan for that in-kerf optical macro to be altered based on the results of the comparison between the second predicted structure 600' and the first predicted structure 600 and further based on an evaluation of the 3D images. Alteration of the plan for alignment mark can include employing the process flow generator/editor 143 to adjust the process steps in order to facilitate alignment of the opening 656 in the mask 655 with the interface 613. For example, prior to formation of the multi-layer stack 650, a sacrificial nitride pad 621 can be formed on the oxide layer 620 above the first semiconductor material portion 611 such that one end 623 of the sacrificial nitride pad 621 is aligned vertically with the interface 613 between the first semiconductor material portion 611 and the second semiconductor material portion 612, as shown in FIG. 8. Additionally, a sacrificial oxide layer 622 can further be formed so as to cover the exposed portion of the oxide layer 620 and the sacrificial nitride pad 621, also as shown in FIG. 8. The end 623 of the sacrificial pad 621 enhances visibility of the interface 613 to the alignment tool such that the resulting opening 656 will not be offset from the interface 613, as illustrated. During subsequent processing, the sacrificial oxide layer 622 and sacrificial nitride pad 621 will be removed and the alignment mark will have the desired structure, as shown in FIG. 9. That is, it will extend vertically through an oxide layer 620, through the thin semiconductor layer 610 between the first semiconductor material portion 611 and the second semiconductor material portion 612 and through a buried oxide (BOX) layer 605 on a silicon substrate 601.

It should be understood that the examples provided are not intended to be limiting and that other types of pattern-dependent failures of in-kerf optical macros structures could similarly be detected and corrected using the above-described 3D emulation process.

As mentioned above, each preliminary in-kerf optical macro verification process is an iterative design process. Thus, after the plan for an in-kerf optical macro has been altered, the processor 120 can perform 3D emulation in light of the alteration to the plan (e.g., given the replacement in-kerf optical macro, the edited in-kerf optical macro, and/or any process flow adjustments). This iterative design process can continue until the predicted structure of each in-kerf optical macro, as indicated by the 3D emulation process, matches the first predicted structure, as indicated in the frame design layout.

Also, as mentioned above, the libraries 151 can include optionally include an optical macro emulation library 154. This optical macro emulation library 154 can store and index the results of the above-described 3D emulation processes. Therefore, during the preliminary verification process for a given in-kerf optical macro included in a frame design layout, the processor 120 can first access the in-kerf optical macro emulation library 154 to determine if a 3D emulation process was previously been performed with respect to that given in-kerf optical macro. If so, the stored 3D images from that previous 3D emulation process can be used for the current preliminary verification process as opposed to unnecessarily repeating the 3D emulation process. If not, then the 3D emulation process will be performed with respect to the specific in-kerf optical macro and the results will be stored in the in-kerf optical macro emulation library 154 for future use. Thus, if multiple instances of the same specific in-kerf optical macro are included in the current frame design layout or a new frame design layout, the 3D emulation process need not be repeated. In other words, the system 100 can include an optical macro emulation library 154, which is continuously updated and evolving to facilitate timely preliminary verification of in-kerf optical macros in the frame design layout and to further facilitate timely wafer-level design layout verification, optimization and validation, as discussed in greater detail below.

After all preliminary in-kerf optical macro verification process(es) have been completed such that all in-kerf optical macros in the frame design layout have been preliminarily verified, the processor 120 can perform a wafer-level design layout verification process including both a chip design layout verification process and a frame design layout verification process. The frame design layout verification process can, in particular, include verification of the in-kerf optical macro(s) by optical simulation (e.g., using appropriate overlay target or alignment mark simulation tools) and by using the results of the 3D emulation of the in-kerf optical macro(s) as inputs. Techniques for performing wafer-level design layout verification processes including execution of various EDS tools 140, such as a LVS tool, a DRC tool, a netlist extractor and one or more simulators 145 (e.g., a SPICE simulator for electronic circuits defined by the netlists, an opti-SPICE simulator for opto-electronic circuits defined by the netlists and/or an optical simulator for optical devices and in-kerf optical macros defined by the netlists), including application of the corresponding design rule decks, are discussed generally above and are well known in the art. Thus, the details of those techniques have been omitted from this specification in order to allow the reader to focus on the salient aspects of the disclosed embodiments. If, during this verification process, either the chip design layout or the frame design layout cannot be verified further iterative design processing can be performed.

Optionally, in addition to wafer-level design layout verification, the processor 120 can further execute one or more of the EDA tools to perform wafer-level design layout optimization, including adjusting the chip and frame design layouts for area consumption, power or performance considerations. Those skilled in the art will recognize optimization is an iterative design process. That is, changes made to wafer-level design layout to optimize area consumption, power or performance optimization may require repeating of the above-described physical design and verification processes (including the preliminary in-kerf optical macro verification processes).

Once the wafer-level design layout is verified, it can be stored in the storage medium 110 in a data format used for the exchange of layout data of integrated circuits and/or symbolic data format (e.g., GDSII, GL1, OASIS, map files, or any other suitable format for storing such design data structures) and further released for use in a wafer-level design layout validation process.

Techniques for performing wafer-level design layout validation processes are discussed generally above and are well known in the art. Thus, the details of those techniques have been omitted from this specification in order to allow the reader to focus on the salient aspects of the disclosed embodiments. However, it should be understood this wafer-level design layout validation process can include manufacturing a test wafer according to a verified wafer-level design layout. That is, multiple chips can be formed on a test wafer according to the verified chip design layout and, while manufacturing of the chips, in-kerf macros can be formed in the frame region of the test wafer according to the verified frame design layout. The fabricated chips on the test wafer can be evaluated and, if they perform as predicted, the chip design layout will be considered validated for use in subsequent product manufacturing. If not, the chip design layout will not be validated and further iterative chip design processing will be required. The fabricated in-kerf macros on the test wafer can also be evaluated and, if they perform as predicted, the frame design layout will be considered validated for use in subsequent product manufacturing. One aspect of the in-kerf macro evaluation process can include a comparison of the actual structure of each fabricated in-kerf optical macro on the frame of the test wafer to the final predicted structure for that in-kerf optical macro, as indicated by the verified frame design layout. If the actual structure of a given fabricated in-kerf optical macros on the test wafer does not match the final predicted structure, then the frame design layout will not be validated and further iterative frame design processing will be required. However, the use of the preliminary in-kerf optical macro verification process improves the overall accuracy of the verified frame design layout and, thereby improves the probability that each fabricated in-kerf optical macro will be formed as predicted and that the wafer-level design layout will be validated. Those skilled in the art will recognize that iterative design processes performed as a result of the wafer-level design layout validation process may include repeating each of above-described physical design and verification processes (including the preliminary in-kerf optical macro verification processes).

It should be noted that, since the final predicted structure of a given in-kerf optical macro, as indicated by the frame design layout, was supported by the 3D emulation performed during preliminary in-kerf optical macro verification process, a finding that the actual structure of that given fabricated in-kerf optical macro on the test wafer does not match the final predicted structure is indicative of an error in that 3D emulation process. In this case, the processor 120 can cause the emulation rules applied by the 3D emulator when generating the 3D images of the in-kerf optical macros to be updated, automatically or by a user, to avoid this same error during subsequent 3D emulation processes.

It should further be noted that at each stage in the design flow where iterative design processing may be performed (e.g., at preliminary in-kerf optical macro verification, at wafer-level design layout verification, at wafer-level design layout optimization, and at wafer-level design layout validation, discussed above) failure modes associated with a given in-kerf optical macro can be noted and analyzed by the processor 120. Additionally, any corrective actions that are carried out in response to an identified failure (e.g., any altered plan that is made for the given in-kerf optical macro due to a mismatch between the predicted structure in the frame design layout and results at verification or validation or as a result of optimization) can be noted and stored in the in-kerf optical macro emulation library 154. That is, the corrected process learning can be registered into the in-kerf optical macro emulation library 154 for consideration during subsequent verification, optimization and validation processes. Thus, the in-kerf optical macro emulation library 154 can be considered an evolving library, which is accessible by the processor 120 during the preliminary in-kerf optical macro verification process and which facilitates timely preliminary verification of the in-kerf optical macros with each new frame design layout and, thereby facilitates timely and accurate wafer-level design layout verification, optimization and validation. Furthermore, given that this in-kerf optical macro emulation library 154 is ever evolving, it can ideally be used to provide baseline optical macro information for use during development of the next advanced technology node.

Once the wafer-level design layout has been verified and validated, the processor 120 can release it to manufacturing and chips and in-kerf macros can be manufactured on product wafers according to the verified and validated wafer-level design layout (including the verified and validated chip and frame design layouts).

Figure 10:
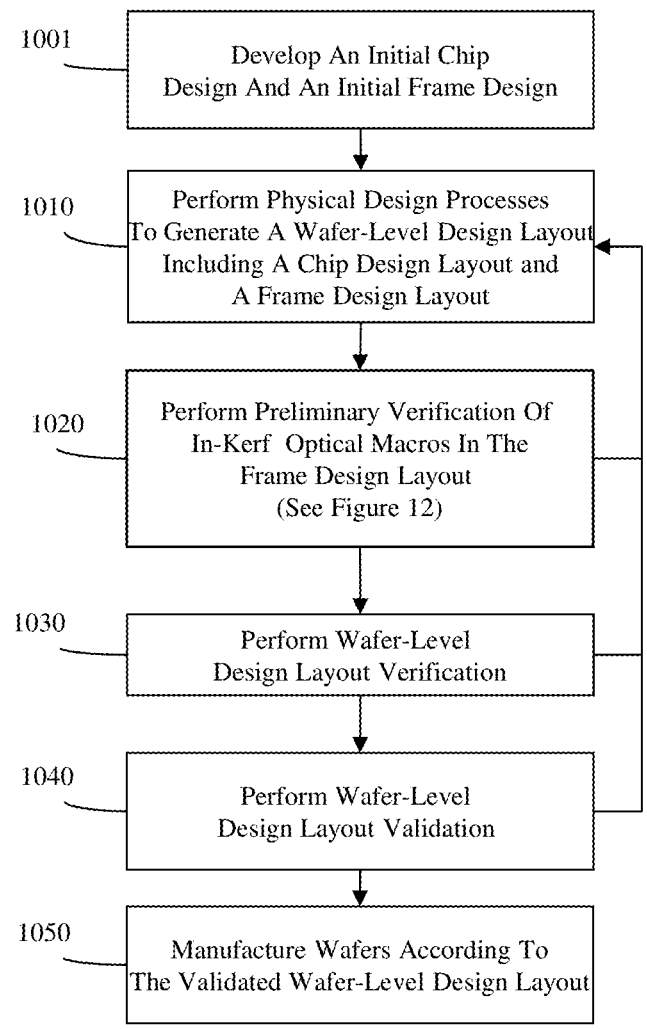
FIG. 10 is a flow diagram illustrating the disclosed design method.

FIG. 10 is a flow diagram illustrating disclosed embodiments of a computer-aided design method that can be implemented using the CAD system 100 described in detail above.

The disclosed method embodiments can be employed during wafer-level design and the inventive aspects of the disclosed embodiments are directed to frame design layout verification and, particularly, to verification of in-kerf optical macros included in the frame design layout to address the problem discussed above regarding the increase in the rate at which wafer-level design layouts are invalidated due to issues associated with in-kerf optical macros. It should be understood that the provided description and illustrations of the disclosed method embodiments are not intended to be limiting and the method can further include additional steps or sub-steps, which are associated with any aspect of wafer-level design including, but not limited to, the physical design processes performed to generate chip and frame design layouts, the chip and frame design layout verification processes and the chip and frame design layout validation processes.

Referring to FIG. 10 in combination with FIG. 1, the method can include receiving design inputs from a user (i.e., a designer) and using the design inputs to develop an initial chip design and to further develop an initial frame design given the initial chip design (see process step 1001). Development of the initial chip and frame designs can be performed by the processor 120 and can include generating schematic diagrams for the chip and frame by selecting library elements from the libraries 152-153 based on the design inputs and establishing connections between those library elements an input or output nodes, as necessary.

The method can further include performing, by the processor 120, of various physical design processes including, but are not limited to, floorplanning, power planning, input/output pin placement, library element placement, clock planning, and wire routing (see process step 1010). The above-described physical design processes and tools used to perform them are well known in the art and, thus, a detailed description has been omitted from this specification in order to allow the reader to focus on the salient aspects of the disclosed embodiments. In any case, the result of the physical design processes at process step 1001 is the generation of a wafer-level design layout including a chip design layout 112 and a frame design layout 113.

The method can further include performing, by the processor 120, of a wafer-level design layout verification process including verification of both the chip design layout verification and the frame design layout (see process step 1030). However, if/when the frame design layout 113 includes one or more in-kerf optical macros (e.g., in-kerf overlay target(s) or in-kerf alignment mark(s), as defined above), the method can include first performing, by the processor 120, a preliminary in-kerf optical macro verification process for each differently designed in-kerf optical macro (e.g., for each different in-kerf optical macro library element) included in the frame design layout 113 (see process step 1020).

Figure 11:
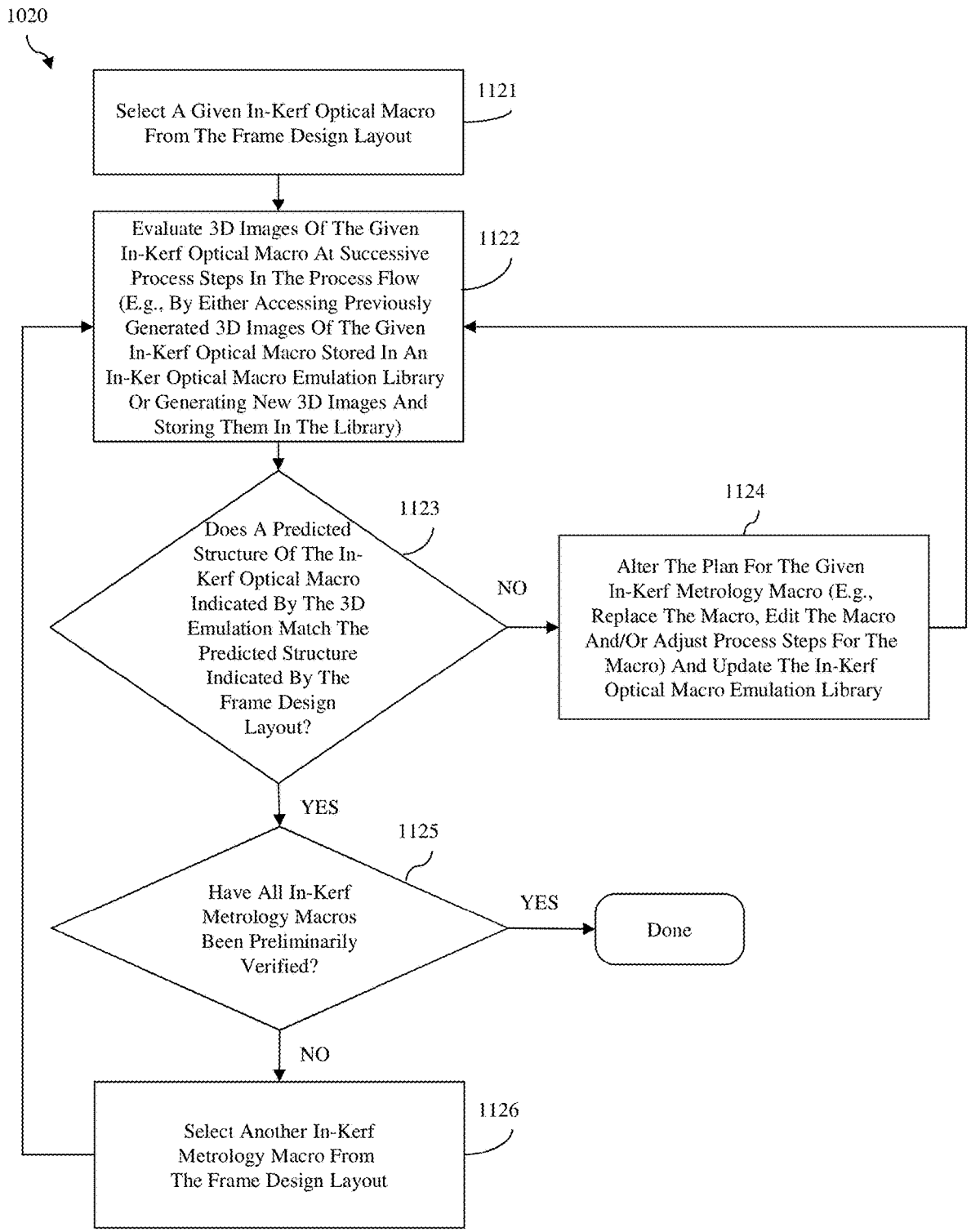
FIG. 11 is a flow diagram illustrating in greater detail process step 1020 of FIG. 10.

FIG. 11 is a flow diagram illustrating in greater detail the preliminary in-kerf optical macro verification process. Specifically, the method can include selecting, by the processor 120, a given in-kerf optical macro from the frame design layout 113 and using a variety of inputs, which are stored in the storage medium 110, to perform a preliminary verification process with respect to this given in-kerf optical macro (see process step 1121). The inputs can include, but are not limited to, the frame design layout 113 and corresponding process flow(s) for forming the given in-kerf optical macros. It should be noted that the structure of the given in-kerf optical macro included in the frame design layout 113 is considered a predicted structure (referred to herein as the first predicted structure), which has been determined given the technology node-specific design rules (i.e., the design rule decks 156) applied during the various physical design processes mentioned above.

To accomplish a preliminary in-kerf optical macro verification process for a given in-kerf optical macro, a 3D emulation process must be performed. During the 3D emulation process, 3D images of the in-kerf optical macro at successive process steps within the corresponding process flow can be generated and can indicate a second predicted structure for that in-kerf optical macro. As mentioned above with regard to the system embodiments, an in-kerf optical macro emulation library 154 can store results of 3D emulation processes performed for various in-kerf optical macros by a processor 120 executing a 3D emulation tool 144. During the preliminary in-kerf optical macro verification process, this in-kerf optical macro emulation library 154 can be accessed to acquire previously generated 3D images for the given in-kerf optical macro (e.g., during design of a different frame layout or during a previous iteration of the same frame design layout). If there are no previously generated 3D images for the given in-kerf optical macro, then the 3D emulation process can be performed and the results (i.e., the 3D images) can be stored in the in-kerf optical macro emulation library 154. In any case, the preliminary in-kerf optical macro verification process can further include evaluating the 3D images and further comparing the first predicted structure for the in-kerf optical macro (which was previously determined and included in the frame design layout 113) to the second predicted structure for the in-kerf optical macro (as indicated by the 3D images) in order to determine whether or not that given in-kerf optical macro should be preliminarily verified (see process steps 1122-1123). The comparison of the two predicted structures at process step 1123 can be performed automatically by the processor 120 or by a user.

If/when the second predicted structure differs from the first predicted structure, the given in-kerf optical macro will not be preliminarily verified and the plan for the given in-kerf optical macro can be altered using an iterative design process that is employed, prior to frame design layout verification, in order to compensate for misapplication of technology-node specific process assumptions used when the first predicted structure was determined (see process step 1124). Alteration of the plan for the in-kerf optical macro can include, but it not limited to, replacing the in-kerf optical macro with a replacement in-kerf optical macro, editing the design of the in-kerf optical macro, or changing one or more process steps in the process flow for the in-kerf optical macro. More specifically, as mentioned above, the design rules (i.e., the design rule decks 156) applied when generating the chip and frame design layouts during the physical design processes are based on process assumptions associated with different fabrication levels of chips on a wafer at a specific technology node. These process assumptions can include critical dimensions associated with on-chip patterned features. However, the critical dimensions associated with the on-chip patterned features may be significantly smaller than the critical dimensions associated with the patterned features of the given in-kerf optical macro such that one or more of the process assumptions are inapplicable to that given in-kerf optical macro. When this occurs, the given in-kerf optical macro may not be formed as predicted. Thus, the embodiments disclosed herein provide a means for detecting when technology-node specific process assumptions have been misapplied to a given in-kerf optical macro and a means for altering a plan associated with that in-kerf optical macro in order to compensate for this misapplication of the technology-node specific process assumptions. Specifically, the method embodiments disclosed herein employ 3D emulation of the process flows for the in-kerf optical macros considering the specifications and, particularly, the critical dimensions for those in-kerf optical macros. The 3D images produced during 3D emulation facilitate the visualization and analysis of each step in a process flow including those steps that may be pattern-dependent (including, but not limited to, deposition processes, etch processes and alignment processes) and that, due to the larger critical dimensions of the in-kerf optical macros, may result in optical macro structure failures. For example, the 3D shapes of trenches (e.g., volume or length, width and depth) at one fabrication level can impact whether or not, during a subsequent deposition process, the trenches will be filled. Similarly, the 3D shapes of previously filled trenches (e.g., volume or length, width and depth) at one fabrication level can impact whether or not, during a subsequent etch process, all fill material can be selectively removed those trenches. Additionally, the dimensions of alignment features at one fabrication level may impact whether or not those features are visible to the appropriate alignment tools at subsequent fabrication levels. By performing 3D emulation and evaluating the resulting 3D images, the disclosed method embodiments provide a means for detecting pattern-dependent process steps that can result in in-kerf optical macro structure failures (due to the relatively large critical dimensions) and for determining a plan to correct for such failures. See Examples I and II provided above for a more detailed discussion of how the plan for the in-kerf optical macro can be altered at process step 1124.

As mentioned above, each preliminary in-kerf optical macro verification process is an iterative design process. Thus, after the plan has been altered, the in-kerf optical macro emulation library can be updated with the proposed correction. Furthermore, further verification including 3D emulation at process step 1122 can be performed in light of the alteration to the plan (e.g., given the replacement in-kerf optical macro, the edited in-kerf optical macro, and/or any process flow adjustments). That is, 3D emulation of the replacement in-kerf optical macro (if not previously performed and stored), of the edited in-kerf optical macro, or of the adjusted process flow can be performed. Then, the predicted structure, as indicated by the altered plan, and the predicted structure, as indicated by the 3D images of the 3D emulation process, can be compared to determine if they match. This iterative design process can continue until the predicted structures match. That is, if/when a determination is made at process step 1123 that the second predicted structure of a given in-kerf optical macro, as indicated by the 3D emulation, matches the first predicted structure of the given in-kerf optical macro, as indicated by the frame design layout, then a determination will be made if all in-kerf optical macros have been preliminary verified (see process step 1125). If not, another in-kerf optical macro will be selected from the frame design layout at process step 1126 and process step 1122 will be performed with respect to that in-kerf optical macro. If so, then preliminary in-kerf optical macro verification at process step 1020 of FIG. 10 will be considered complete.

It should be noted that the use of the above-described in-kerf optical macro emulation library 154, which is continuously updated and evolving, facilitates timely preliminary verification of in-kerf optical macros in the frame design layout at process step 1020 and further facilitates timely wafer-level design layout verification, optimization and validation at processes 1030-1040, as discussed in greater detail below.

Referring again to FIG. 10, after all preliminary in-kerf optical macro verification process(es) have been completed at process step 1020 such that all in-kerf optical macros in the frame design layout have been preliminarily verified, a wafer-level design layout verification process, including both a chip design layout verification process and a frame design layout verification process, can be performed by the processor (see process step 1030). The frame design layout verification process can, in particular, include verification of the in-kerf optical macro(s) by optical simulation (e.g., using appropriate overlay target or alignment mark simulation tools) and by using the results of the 3D emulation of the in-kerf optical macro(s) as inputs. Techniques for performing wafer-level design layout verification processes including performing a layout-versus-schematic check, performing a design rules check, extracting netlists and performing simulations based on the netlists (e.g., SPICE simulations of electronic circuits defined by the netlists, opti-SPICE simulations of opto-electronic circuits defined by the netlists and/or optical simulations of optical devices and in-kerf optical macros defined by the netlists) are discussed generally above and are well known in the art. Thus, the details of those techniques have been omitted from this specification in order to allow the reader to focus on the salient aspects of the disclosed embodiments. If, during this verification process, either the chip design layout or the frame design layout cannot be verified further iterative design processing can be performed. Once the wafer-level design layout is verified, it can be stored in the storage medium 110 in a data format used for the exchange of layout data of integrated circuits and/or symbolic data format (e.g., GDSII, GL1, OASIS, map files, or any other suitable format for storing such design data structures) and further released for use in a wafer-level design layout validation process.

Optionally, in addition to wafer-level design layout verification, the method can include further performing wafer-level design layout optimization, including adjusting the chip and frame design layouts for area consumption, power or performance considerations. Those skilled in the art will recognize optimization is an iterative design process. That is, changes made to wafer-level design layout to optimize area consumption, power or performance optimization may require repeating of the above-described physical design and verification processes (including the preliminary in-kerf optical macro verification processes).

The method can further include performing a wafer-level design layout validation process (see process step 1040). Techniques for performing wafer-level design layout validation processes are discussed generally above and are well known in the art. Thus, the details of those techniques have been omitted from this specification in order to allow the reader to focus on the salient aspects of the disclosed embodiments. However, it should be understood this wafer-level design layout validation process can include manufacturing a test wafer according to a verified wafer-level design layout. That is, multiple chips can be formed on a test wafer according to the verified chip design layout and, while manufacturing of the chips, in-kerf macros can be formed in the frame region of the test wafer according to the verified frame design layout. The fabricated chips on the test wafer can be evaluated and, if they perform as predicted, the chip design layout will be considered validated for use in subsequent product manufacturing. If not, the chip design layout will not be validated and further iterative chip design processing will be required. The fabricated in-kerf macros on the test wafer can also be evaluated and, if they perform as predicted, the frame design layout will be considered validated for use in subsequent product manufacturing. One aspect of the in-kerf macro evaluation process can include a comparison of the actual structure of each fabricated in-kerf optical macro on the frame of the test wafer to the final predicted structure for that in-kerf optical macro, as indicated by the verified frame design layout. If the actual structure of a given fabricated in-kerf optical macros on the test wafer does not match the final predicted structure, then the frame design layout will not be validated and further iterative frame design processing will be required. However, the use of the preliminary in-kerf optical macro verification process improves the overall accuracy of the verified frame design layout and, thereby improves the probability that each fabricated in-kerf optical macro will be formed as predicted and that the wafer-level design layout will be validated. Those skilled in the art will recognize that iterative design processes performed as a result of the wafer-level design layout validation process may include repeating each of above-described physical design and verification processes (including the preliminary in-kerf optical macro verification processes).

It should be noted that, since any final predicted structure of a given in-kerf optical macro, as indicated by the frame design layout, was supported by the 3D emulation performed during preliminary in-kerf optical macro verification process, a finding that the actual structure of that given fabricated in-kerf optical macro on the test wafer does not match the final predicted structure is indicative of an error in that 3D emulation process. In this case, the method can further include updating, either automatically or by a user, the emulation rules applied by the 3D emulator when generating the 3D images of the in-kerf optical macros to avoid this same error during subsequent 3D emulation processes.

It should further be noted that at each stage in the design flow where iterative design processing may be performed (e.g., at preliminary in-kerf optical macro verification, at wafer-level design layout verification, at wafer-level design layout optimization, and at wafer-level design layout validation, discussed above) failure modes associated with a given in-kerf optical macro can be noted and analyzed. Additionally, any corrective actions that are carried out in response to an identified failure (e.g., any altered plan that is made for the given in-kerf optical macro due to a mismatch between the predicted structure and results at verification or validation or as a result of optimization) can be noted and stored in the in-kerf optical macro emulation library 154. That is, the corrected process learning can be registered into the in-kerf optical macro emulation library 154 for consideration during subsequent verification, optimization and validation processes. Thus, the in-kerf optical macro emulation library 154 can be considered an evolving library, which is accessible during the preliminary in-kerf optical macro verification process and which facilitates timely preliminary verification of the in-kerf optical macros with each new frame design layout and, thereby facilitates timely and accurate wafer-level design layout verification, optimization and validation. Furthermore, given that this in-kerf optical macro emulation library 154 is ever evolving, it can ideally be used to provide baseline optical macro information for use during development of the next advanced technology node.

Once the wafer-level design layout has been verified and validated, it can be released to manufacturing, where chips and in-kerf macros are manufactured on product wafers according to the verified and validated wafer-level design layout (including the verified and validated chip and frame design layouts) (see process step 1050).

Also disclosed herein are embodiments of a computer program product for implementing the above-described method. Specifically, the computer program product can be a computer readable storage medium with program instructions embodied therewith (e.g., stored thereon). These program instructions can be executable by a processor to cause the processor to perform the above-described wafer-level design method.

More specifically, the present invention may be a method, a system, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a solid state drive, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may incorporate copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which has one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 12:
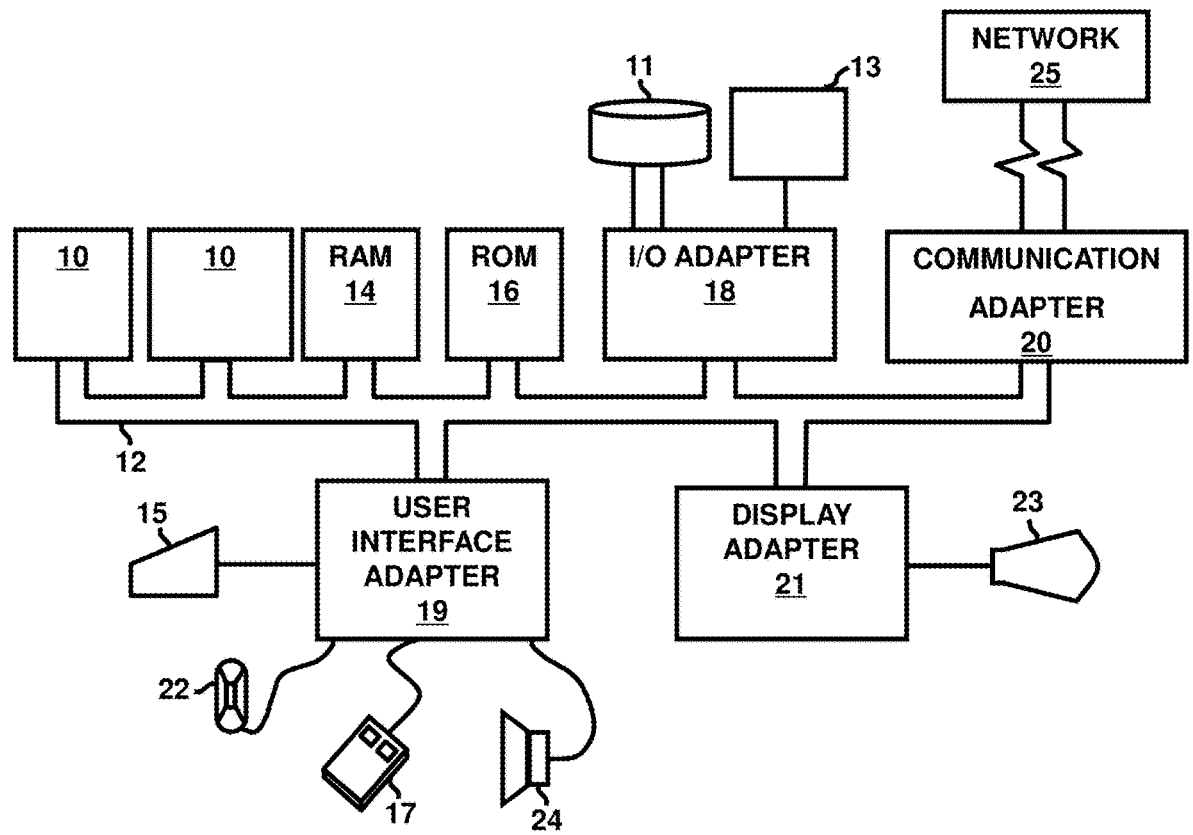
FIG. 12 is a schematic diagram illustrating an exemplary hardware configuration that can be employed to implement the disclosed system, method and computer program product.

A representative hardware environment (i.e., a computer system) for implementing disclosed design method, system and computer program product embodiments is depicted in FIG. 12. This schematic drawing illustrates a hardware configuration of an information handling/computer system in accordance with the embodiments herein. The system has at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and solid state drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    accessing, by a processor from a computer-readable storage medium, a frame design layout comprising at least one in-kerf optical macro and a process flow for forming the in-kerf optical macro on a wafer,
        wherein the frame design layout indicates a first predicted structure for the in-kerf optical macro determined based on design rules for a specific technology node,
        wherein the design rules are based on process assumptions associated with different fabrication levels of chips on the wafer at the specific technology node,
        wherein the process assumptions comprise critical dimensions associated with on-chip patterned features, and
        wherein the critical dimensions associated with the on-chip patterned features are smaller than critical dimensions associated with in-kerf optical macro patterned features such that at least one of the process assumptions upon which the design rules are based is inapplicable to the in-kerf optical macro; and
    performing, by the processor, a preliminary in-kerf optical macro verification process, wherein the preliminary in-kerf optical macro verification process is an iterative design process that compensates for using inapplicable process assumptions when generating the first predicted structure and wherein the preliminary in-kerf optical macro verification comprises:
        accessing, from an emulation library, three-dimensional images of the in-kerf optical macro at successive process steps within the process flow;
        evaluating the three-dimensional images to determine a second predicted structure of the in-kerf optical macro;
        comparing the first predicted structure to the second predicted structure; and
        when the second predicted structure of the in-kerf optical macro differs from the first predicted structure at least in material composition, causing a plan for the in-kerf optical macro to be altered.

2. The method of claim 1, wherein the performing of the preliminary in-kerf optical macro verification process comprises:
    initially accessing the emulation library to determine if the in-kerf optical macro has previously been subjected to an emulation process such that the three-dimensional images of the in-kerf optical macro were previously generated and stored in the emulation library;
    when the in-kerf optical macro has previously been subjected to the emulation process, evaluating the three-dimensional images previously stored in the emulation library; and
    when the in-kerf optical macro has not previously been subjected to the emulation process, performing the emulation process to generate the three-dimensional images and storing the three-dimensional images in the emulation library for access during the preliminary in-kerf optical macro verification process.

3. The method of claim 2, further comprising repeatedly updating the emulation library to include results of three-dimensional emulation processes performed for each in-kerf optical macro.

4. The method of claim 1,
    wherein the in-kerf optical macro comprises an overlay target,
    wherein the critical dimensions associated with the on-chip patterned features comprise any of minimum and maximum widths of the on-chip patterned features, minimum and maximum lengths of the on-chip patterned features, and minimum and maximum pitches of the on-chip patterned features,
    wherein the successive steps comprise deposition and etch steps,
    wherein the process assumptions indicate expected results of the deposition and etch steps given the critical dimensions associated with the on-chip patterned features, and
    wherein differences in the material composition between the first predicted structure and the second predicted structure are due to the critical dimensions associated with the on-chip patterned features being smaller than the critical dimensions associated with the in-kerf optical macro patterned features such that the expected results of at least one of the deposition and etch steps are inapplicable to the overlay target.

5. The method of claim 1, wherein, when the second predicted structure matches the first predicted structure, the in-kerf optical macro is preliminarily verified and the method further comprises performing a frame design layout verification process comprising performing optical simulations of any in-kerf optical macros in the frame design layout.

6. The method of claim 5, further comprising, after the frame design layout verification process, releasing a verified frame design layout for use in a wafer-level design validation process.

7. The method of claim 1, wherein the plan is altered by replacing the in-kerf optical macro with a replacement in-kerf optical macro selected from an in-kerf library elements library, based on results of a comparison between the second predicted structure and the first predicted structure.

8. The method of claim 1, wherein the plan is altered by editing a design of the in-kerf optical macro based on results of a comparison between the second predicted structure and the first predicted structure.

9. The method of claim 1, wherein the plan is altered by changing the process flow for forming the in-kerf optical macro based on results of a comparison between the second predicted structure and the first predicted structure and wherein the changing of the process flow comprises any of adding a process step to the process flow, removing a process step from the process flow, and adjusting a specification for a process step within the process flow.

10. A system comprising:
a computer-readable storage medium storing a frame design layout comprising at least one in-kerf optical macro and further storing a process flow for forming the in-kerf optical macro on a wafer,
wherein the frame design layout indicates a first predicted structure for the in-kerf optical macro determined based on design rules for a specific technology node,
wherein the design rules are based on process assumptions associated with different fabrication levels of chips on the wafer at the specific technology node,
wherein the process assumptions comprise critical dimensions associated with on-chip patterned features, and
wherein the critical dimensions associated with the on-chip patterned features are smaller than critical dimensions associated with in-kerf optical macro patterned features such that at least one of the process assumptions upon which the design rules are based is inapplicable to the in-kerf optical macro; and
a processor in communication with the computer-readable storage medium, wherein the processor performs a preliminary in-kerf optical macro verification process, wherein the preliminary in-kerf optical macro verification process is an iterative design process that compensates for using inapplicable process assumptions when generating the first predicted structure, and wherein the preliminary in-kerf optical macro verification comprises:
accessing, from an emulation library, three-dimensional images of the in-kerf optical macro at successive process steps within the process flow;
evaluating the three-dimensional images to determine a second predicted structure of the in-kerf optical macro;
comparing the first predicted structure to the second predicted structure; and
when the second predicted structure for the in-kerf optical macro differs from the first predicted structure at least in material composition, causing a plan for the in-kerf optical macro to be altered.

11. The system of claim 10, wherein the processor further performs the preliminary in-kerf optical macro verification process by:
initially accessing the emulation library to determine if the in-kerf optical macro has previously been subjected to an emulation process such that the three-dimensional images of the in-kerf optical macro were previously generated and stored in the emulation library;
when the in-kerf optical macro has been previously subjected to the emulation process, evaluating the three-dimensional images previously stored in the emulation library; and
when the in-kerf optical macro has not been previously subjected to the emulation process, performing the emulation process to generate the three-dimensional images and storing the three-dimensional images in the emulation library for access during the preliminary in-kerf optical macro verification process.

12. The system of claim 11, wherein the emulation library is repeatedly updated to include results of three-dimensional emulation processes performed for each in-kerf optical macro.

13. The system of claim 10,
wherein the in-kerf optical macro comprises an overlay target,
wherein the critical dimensions associated with the on-chip patterned features comprise any of minimum and maximum widths of the on-chip patterned features, minimum and maximum lengths of the on-chip patterned features, and minimum and maximum pitches of the on-chip patterned features,
wherein the successive steps comprise deposition and etch steps,
wherein the process assumptions indicate expected results of the deposition and etch steps given the critical dimensions associated with the on-chip patterned features, and
wherein differences in the material composition between the first predicted structure and the second predicted structure are due to the critical dimensions associated with the on-chip patterned features being smaller than the critical dimensions associated with the in-kerf optical macro patterned features such that the expected results of at least one of the deposition and etch steps are inapplicable to the overlay target.

14. The system of claim 10, wherein, when the second predicted structure matches the first predicted structure, the in-kerf optical macro is considered preliminarily verified and the processor performs a frame design layout verification process comprising performing optical simulations of any in-kerf optical macros in the frame design layout.

15. The system of claim 14, wherein, after the frame design layout verification process, the processor releases a verified frame design layout for use in a wafer-level design validation process.

16. The system of claim 10, wherein the plan is altered by replacing the in-kerf optical macro with a replacement in-kerf optical macro selected from an in-kerf library elements library, based on results of a comparison between the second predicted structure and the first predicted structure.

17. The system of claim 10, wherein the plan is altered by editing a design of the in-kerf optical macro based on results of a comparison between the second predicted structure and the first predicted structure.

18. The system of claim 10, wherein the plan is altered by changing the process flow for forming the in-kerf optical macro based on results of a comparison between the second predicted structure and the first predicted structure.

19. The system of claim 18, wherein the changing of the process flow comprises any of adding a process step to the process flow, removing a process step from the process flow, and adjusting a specification for a process step within the process flow.

20. A method comprising:
accessing, by a processor from a computer-readable storage medium, a frame design layout comprising at least one in-kerf optical macro comprising an alignment mark on a wafer and a process flow for forming the in-kerf optical macro on a wafer, wherein the frame design layout indicates a first predicted structure for the in-kerf optical macro determined based on design rules for a specific technology node,
wherein the design rules are based on process assumptions associated with different fabrication levels of chips on the wafer at the specific technology node,
wherein the process assumptions comprise critical dimensions associated with on-chip patterned features, and
wherein the critical dimensions associated with the on-chip patterned features are smaller than critical dimensions associated with in-kerf optical macro patterned features such that at least one of the process assumptions upon which the design rules are based is inapplicable to the in-kerf optical macro; and
performing, by the processor, a preliminary in-kerf optical macro verification process, wherein the preliminary in-kerf optical macro verification process is an iterative design process that compensates for using inapplicable process assumptions when generating the first predicted structure and wherein the preliminary in-kerf optical macro verification comprises:
accessing, from an emulation library, three-dimensional images of the in-kerf optical macro at successive process steps within the process flow;
evaluating the three-dimensional images to determine a second predicted structure of the in-kerf optical macro;
comparing the first predicted structure to the second predicted structure; and
when the second predicted structure of the in-kerf optical macro differs from the first predicted structure with respect to a position of the alignment mark relative to an interface between different portions of the wafer below the alignment mark, causing a plan for the in-kerf optical macro to be altered.

* * * * *